United States Patent
Fujita

(10) Patent No.: US 10,692,792 B2
(45) Date of Patent: Jun. 23, 2020

(54) ELECTRONIC DEVICE

(71) Applicant: DENSO CORPORATION, Kariya, Aichi-pref. (JP)

(72) Inventor: Hirohito Fujita, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/080,756

(22) PCT Filed: Apr. 12, 2017

(86) PCT No.: PCT/JP2017/014897
§ 371 (c)(1),
(2) Date: Aug. 29, 2018

(87) PCT Pub. No.: WO2017/199647
PCT Pub. Date: Nov. 23, 2017

(65) Prior Publication Data
US 2019/0221490 A1    Jul. 18, 2019

(30) Foreign Application Priority Data

May 16, 2016   (JP) ................................ 2016-098123

(51) Int. Cl.
*H01L 23/31*    (2006.01)
*H01L 23/495*   (2006.01)
(Continued)

(52) U.S. Cl.
CPC .......... *H01L 23/3142* (2013.01); *H01L 23/28* (2013.01); *H01L 23/3107* (2013.01);
(Continued)

(58) Field of Classification Search
None
See application file for complete search history.

(56) References Cited

U.S. PATENT DOCUMENTS

2004/0159962 A1*  8/2004  Ishiyama .............. H01L 23/473
                                                          257/787
2008/0136015 A1*  6/2008  Lee ....................... H01L 23/142
                                                          257/712
(Continued)

FOREIGN PATENT DOCUMENTS

JP    S58-144855 U1   9/1983
JP    S61-253845 A    11/1986
(Continued)

*Primary Examiner* — Charles D Garber
*Assistant Examiner* — Steven M Christopher
(74) *Attorney, Agent, or Firm* — Posz Law Group, PLC

(57) ABSTRACT

An electronic device includes an electronic component, a sealing resin body, and a plurality of conductive members electrically connected to the electronic component in the sealing resin body, including respective portions exposed from the sealing resin body to the outside of the sealing resin body, and having different potentials. The conductive members include a heat sink and a terminal extending from an inside to the outside of the sealing resin body. A surface of the terminal includes, as a part covered with the sealing resin body, a higher adhesion part and a lower adhesion part. The lower adhesion part is provided in an entire portion of a back surface of the terminal, the back surface being opposite to a connection surface of the terminal which is adjacent to a connection part electrically connected to the electronic component. The higher adhesion part is provided in the connection surface.

18 Claims, 10 Drawing Sheets

(51) Int. Cl.
*H01L 23/433* (2006.01)
*H01L 23/48* (2006.01)
*H01L 23/28* (2006.01)
*H01L 25/07* (2006.01)
*H01L 23/367* (2006.01)
*H01L 23/498* (2006.01)
*H01L 23/00* (2006.01)
*H05K 7/02* (2006.01)

(52) U.S. Cl.
CPC ........ *H01L 23/367* (2013.01); *H01L 23/4334* (2013.01); *H01L 23/48* (2013.01); *H01L 23/49548* (2013.01); *H01L 23/49562* (2013.01); *H01L 23/49568* (2013.01); *H01L 23/49575* (2013.01); *H01L 23/49811* (2013.01); *H01L 24/49* (2013.01); *H01L 25/072* (2013.01); *H05K 7/02* (2013.01); *H01L 24/32* (2013.01); *H01L 24/45* (2013.01); *H01L 2224/291* (2013.01); *H01L 2224/29007* (2013.01); *H01L 2224/29036* (2013.01); *H01L 2224/32245* (2013.01); *H01L 2224/33* (2013.01); *H01L 2224/33181* (2013.01); *H01L 2224/45124* (2013.01); *H01L 2224/48247* (2013.01); *H01L 2224/49175* (2013.01); *H01L 2224/83447* (2013.01); *H01L 2924/181* (2013.01)

(56) References Cited

U.S. PATENT DOCUMENTS

| | | | |
|---|---|---|---|
| 2013/0229147 A1* | 9/2013 | Amagai | H01M 2/1077 320/107 |
| 2014/0327121 A1 | 11/2014 | Yamaguchi et al. | |
| 2015/0028466 A1* | 1/2015 | Kadoguchi | H01L 23/3107 257/676 |
| 2017/0133314 A1* | 5/2017 | Lu | H01L 21/4846 |

FOREIGN PATENT DOCUMENTS

| | | |
|---|---|---|
| JP | 2006-179655 A | 7/2006 |
| JP | 2011-134813 A | 7/2011 |
| JP | 2015-112015 A | 6/2015 |
| JP | 2015-204319 A | 11/2015 |

* cited by examiner

ELECTRONIC DEVICE

CROSS REFERENCE TO RELATED APPLICATIONS

This application is a U.S. national phase of International Application No. PCT/JP2017/014897 filed on Apr. 12, 2017 and is based on Japanese Patent Application No. 2016-98123 filed on May 16, 2016, the disclosures of which are incorporated herein by reference.

TECHNICAL FIELD

The present disclosure relates to an electronic device of a resin-sealed type.

BACKGROUND ART

As disclosed in Patent Literature 1, an electronic device has been known which includes an electronic component, a sealing resin body sealing the electronic component, and a plurality of conductive members that are electrically connected to the electronic component in the sealing resin body, include respective portions exposed from the sealing resin body to the outside, and have different potentials. The conductive members include external connection terminals extending from the inside of the sealing resin body to the outside thereof.

The electronic device in Patent Literature 1 is used for a power conversion device. The electronic device has, as the electronic component, a power semiconductor element forming an inverter. The electronic device also has, as the external connection terminals, a positive electrode terminal (P-terminal), a negative electrode terminal (N-terminal), an AC terminal, and signal terminals, which have different potentials.

PRIOR ART LITERATURE

Patent Literature

Patent Literature 1: JP 2015-112015 A

SUMMARY OF INVENTION

In an electronic device, a sealing resin body allows a creeping distance to be ensured between conductive members (external connection terminals) having different potentials.

The external connection terminals are connected to the bus bars of an external device or the like. When the distances from the portions of the external connection terminals which are fixed to the external device to the outer peripheral end (the portions of the external connection terminals which are fixed by the sealing resin body) of the sealing resin body are short, in the event of vibration of the external connection terminals due to a thermal stress or the vibration transmitted from the outside, the external connection terminals may be broken. Particularly in the electronic device used for the power conversion device, for the purpose of reducing inductance, the distances between the portions of the external connection terminals which are fixed to the external device and the outer peripheral end of the sealing resin body are reduced. Accordingly, the external connection terminals may be broken by vibration.

An object of the present disclosure is to provide an electronic device which can restrict external connection terminals from being broken, while allowing a creeping distance to be ensured between conductive members.

In accordance with an aspect of the present disclosure, an electronic device includes at least one electronic component, a sealing resin body sealing the electronic component, and a plurality of conductive members electrically connected to the electronic component in the sealing resin body, including respective portions exposed from the sealing resin body to the outside, and having different potentials. The conductive members include an external connection terminal extending from the inside of the sealing resin body to the outside of the sealing resin body. A surface of the external connection terminal has a connected part electrically connected to the electronic component, a higher adhesion part having a higher adhesion to the sealing resin body, and a lower adhesion part having an adhesion to the sealing resin body which is lower than that of the higher adhesion part. Each of the higher adhesion part and the lower adhesion part is a portion of the surface of the external connection terminal which is other than the connected part and covered with the sealing resin body. The lower adhesion part is provided in at least one of a connection surface including the connected part and a back surface opposite to the connection surface in a thickness direction to extend from an outer peripheral end of the sealing resin body along an extending direction of the external connection terminal.

In accordance with the above-described aspect, when the external connection terminal connected to an external device vibrates, the sealing resin body peels from at least a portion of the lower adhesion part extending from the outer peripheral end. The peeling of the sealing resin body increases the distance between the portion of the external connection terminal which is fixed to the external device and the portion of the external connection terminal which is fixed by the sealing resin body, i.e., the distance over which the external connection terminal can substantially vibrate. Thus, in the external connection terminal, a portion allowed to peel with the vibration of the external connection terminal when the external connection terminal vibrates is provided in advance. This can restrict the external connection terminal from being broken.

In addition, the higher adhesion part and the lower adhesion part of the external connection terminal are covered with the sealing resin body. Even when the sealing resin body peels from the lower adhesion part with the vibration, a creeping distance remains substantially unchanged. Since it is not that the distance over which the external connection terminal can substantially vibrate is increased by partly removing the portion covered with the sealing resin body, the creeping distance can be ensured.

Thus, it is possible to restrict the external connection terminal from being broken, while ensuring the creeping distance between the conductive members.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
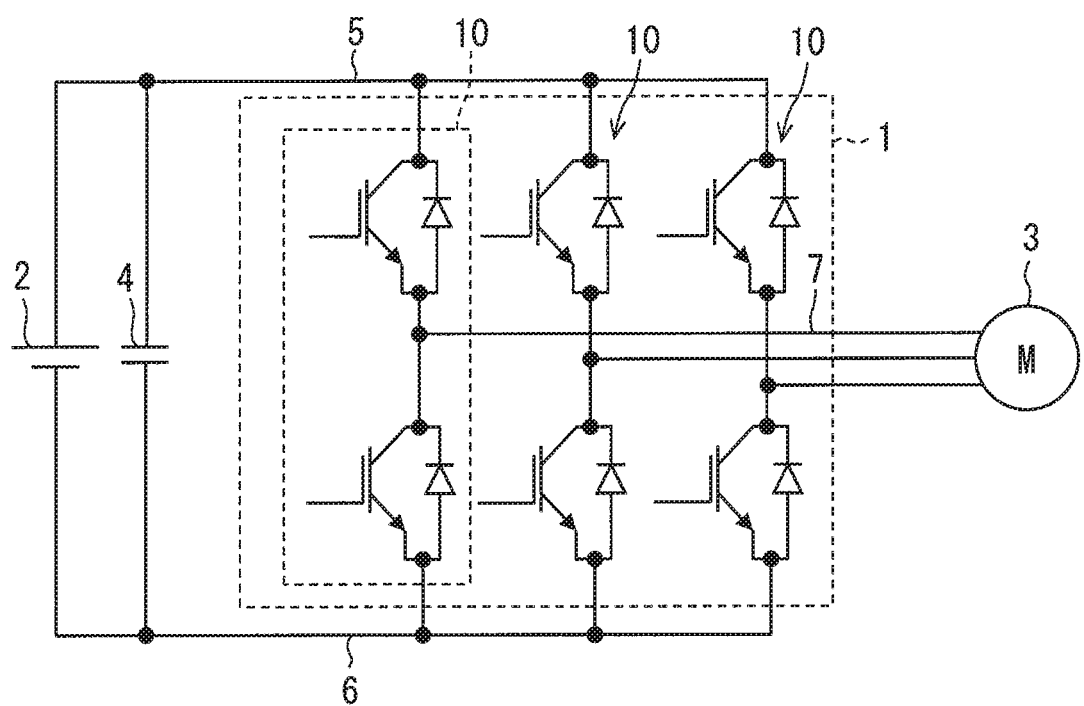
FIG. 1 is a view showing a schematic configuration of a power conversion device to which a semiconductor device according to a first embodiment is applied.

Referring to the drawings, a plurality of embodiments will be described. In the plurality of embodiments, functionally and/or structurally corresponding parts are given the same reference numerals. In the following description, a thickness direction of each of semiconductor chips is shown as a Z-direction, and a direction which is perpendicular to the Z-direction and in which main terminals and signal terminals extend is shown as a Y-direction. Also, a direction perpendicular to both of the Z-direction and the Y-direction is shown as an X-direction. Also, a shape along an XY-plane defined by the X-direction and the Y-direction each described above is assumed to be a two-dimensional shape, unless particularly described otherwise.

First Embodiment

First, on the basis of FIG. 1, a description will be given of an example of a power conversion device to which a semiconductor device is applied.

A power conversion device 1 shown in FIG. 1 is configured so as to convert a DC voltage supplied from a DC power source 2 (battery) to a three-phase AC current and output the three-phase AC current to a three-phase AC motor 3. The power conversion device 1 thus configured is mounted in, e.g., an electric vehicle or a hybrid vehicle. Note that the power conversion device 1 can also convert the power generated by the motor 3 to a DC power and charge the DC power source 2 with the DC power. The reference numeral 4 shown in FIG. 1 denotes a smoothing capacitor.

The power conversion device 1 has a three-phase inverter. The three-phase inverter has upper and lower arms for three phases which are provided between a higher-potential power source line 5 connected to the positive (higher-potential) electrode of the DC power source 2 and a lower-potential power source line 6 connected to the negative (lower-potential) electrode of the DC power source 2. The upper and lower arms in each of the phases are formed of one of semiconductor devices 10. That is, each of the semiconductor devices 10 forms the upper and lower arms of one of the phases.

Each of the semiconductor devices 10 includes IGBTs and back-flow FWDs connected in anti-parallel to the IGBTs. In the present embodiment, the IGBTs and the FWDs are formed in each of semiconductor chips 12 described later. However, the IGBTs and the FWDs may also be formed in different chips. In the present embodiment, the n-channel IGBTs are used. The cathode electrode of each of the FWDs is used also as a collector electrode, and the anode electrode of the FWD is used also as an emitter electrode.

In the semiconductor devices 10, the collector electrodes of the upper-arm IGBTs are electrically connected to the higher-potential power source line 5, while the emitter electrodes of the upper-arm IGBTs are connected to an output line 7 of the motor 3. On the other hand, the collector electrodes of the lower-arm IGBTs are connected to the output line 7 of the motor 3, while the emitter electrodes of the lower-arm IGBTs are connected to the lower-potential power source line 6.

Note that the power conversion device 1 may also include, in addition to the three-phase inverter described above, a boosting converter which boosts the DC voltage supplied from the DC power source 2 and a control unit which controls the operation of each of the switching elements forming the three-phase inverter and the boosting converter.

Next, on the basis of FIGS. 2 to 4, a description will be given of a schematic configuration of the semiconductor device 10.

Figure 2:
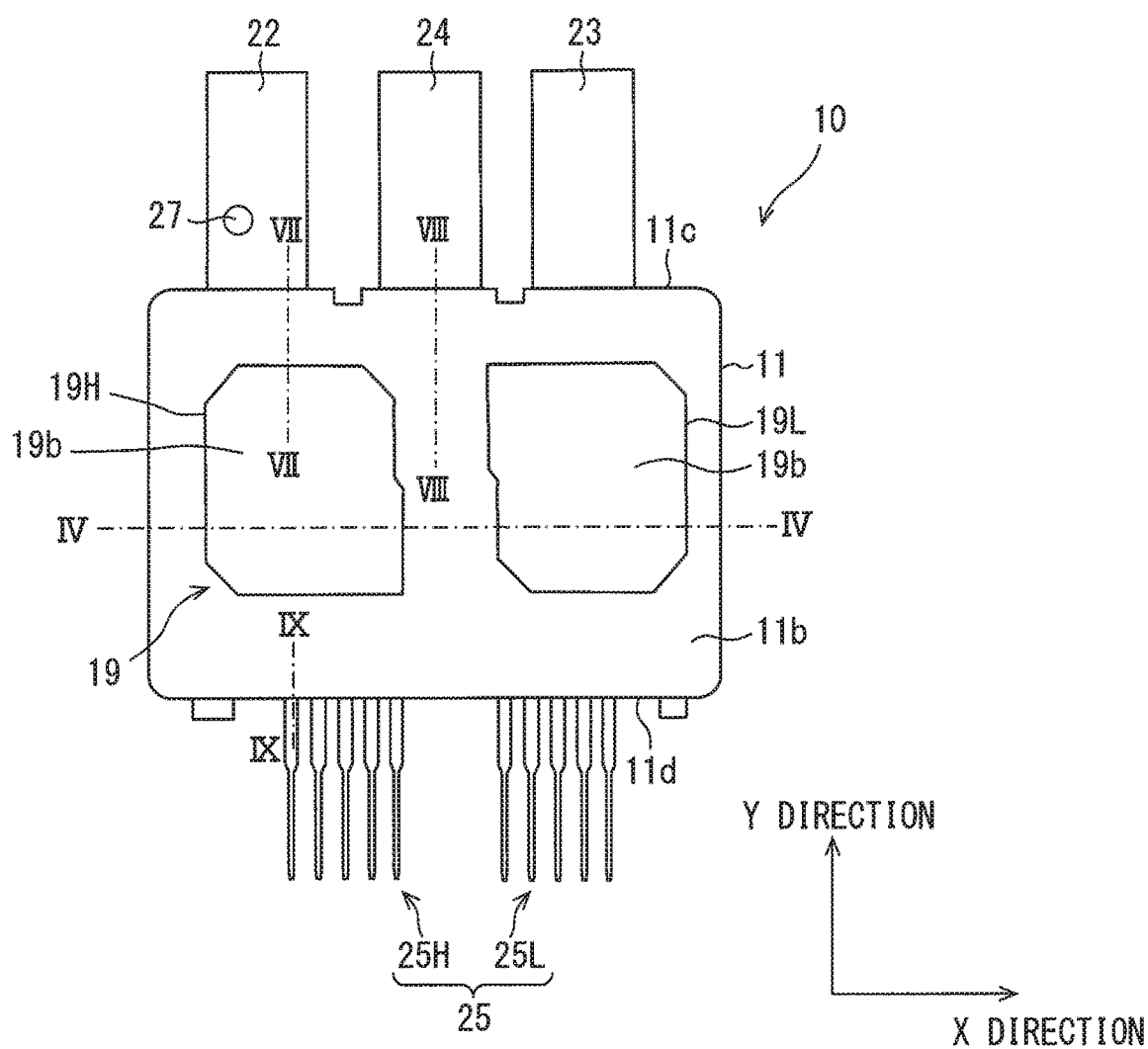
FIG. 2 is a plan view showing a schematic configuration of the semiconductor device according to the first embodiment.
Figure 3:
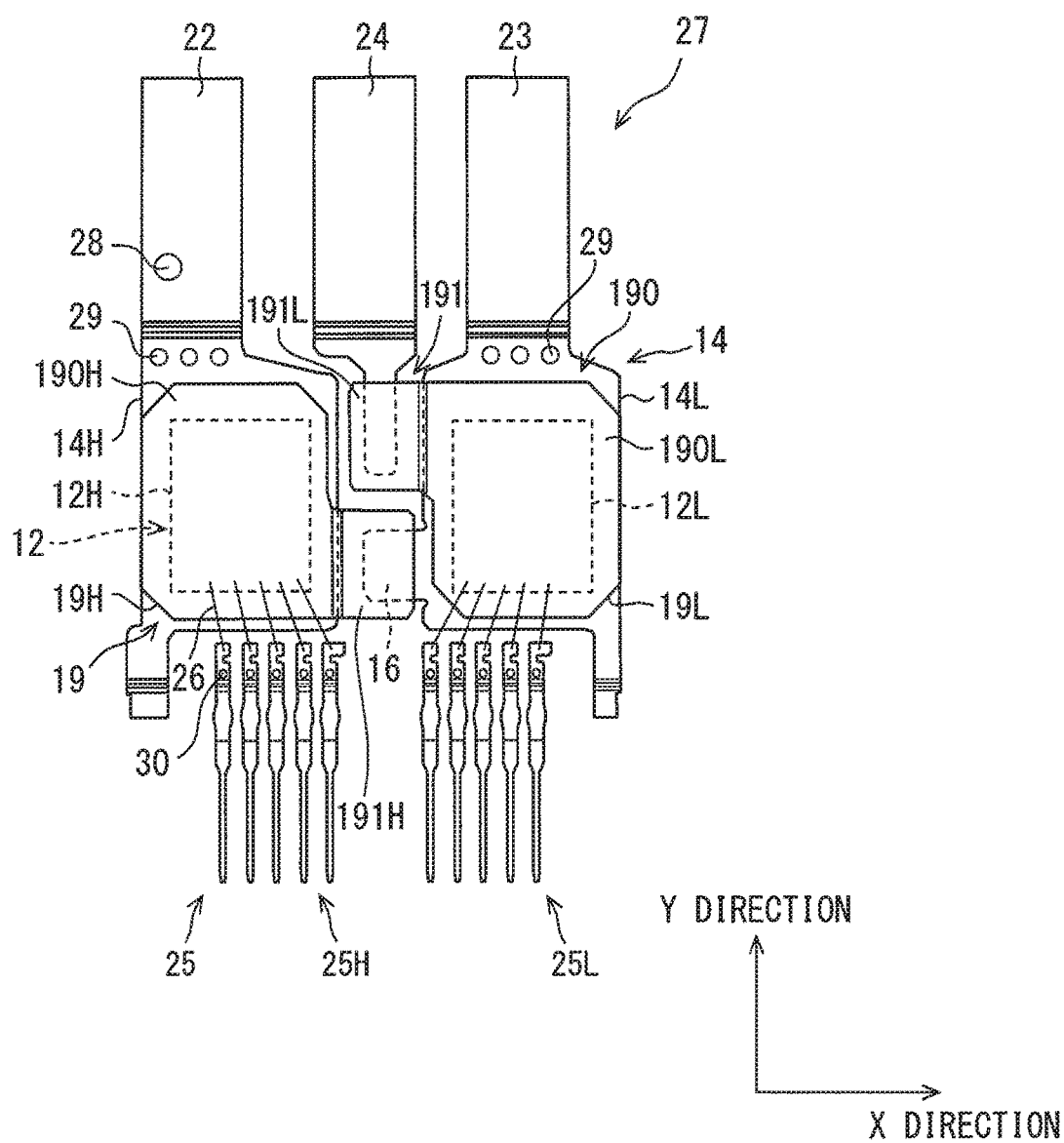
FIG. 3 is a view of the semiconductor device shown in FIG. 2 from which a sealing resin body is omitted.
Figure 4:
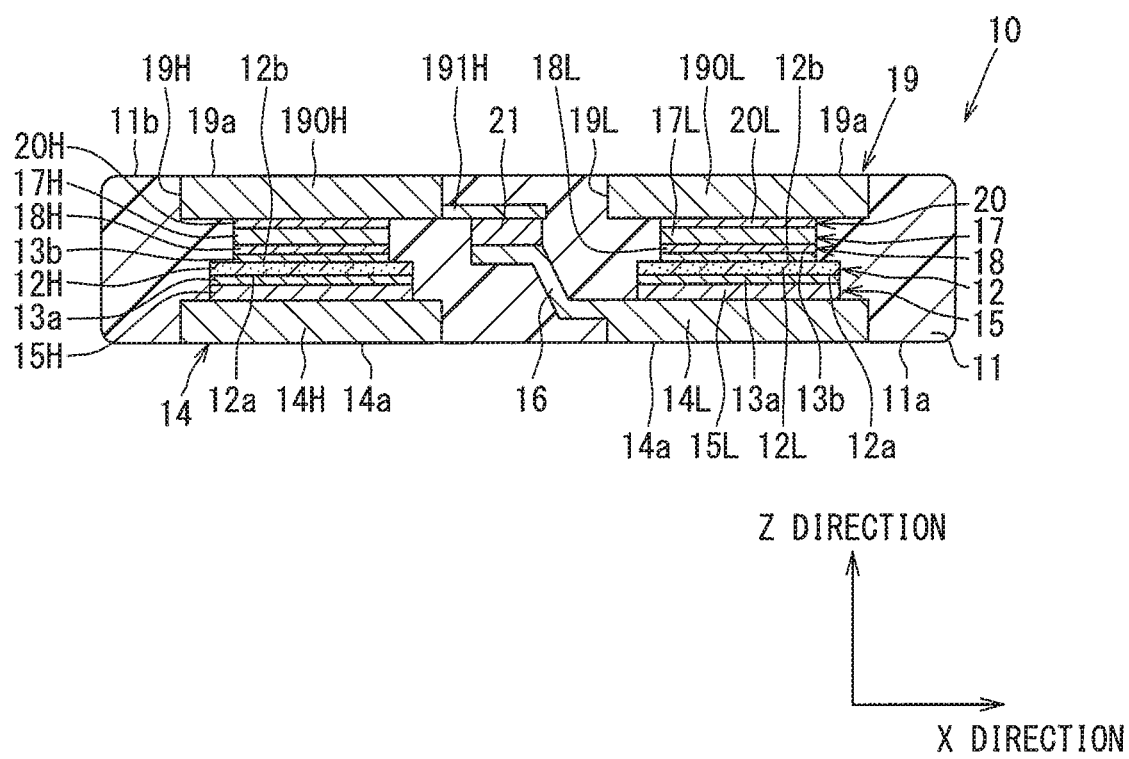
FIG. 4 is a cross-sectional view along the line IV-IV in FIG. 2.

As shown in FIGS. 2 to 4, the semiconductor device 10 includes a sealing resin body 11, the semiconductor chips 12, first heat sinks 14, a joint part 16, terminals 17, second heat sinks 19, main terminals 22, 23, and 24, and signal terminals 25. The semiconductor device 10 corresponds to a resin-sealed electronic device. In the following description, H at the end of each of reference numerals shows that the element denoted thereby is an upper-arm element belonging to the upper arm, while L at the end of each of reference numerals shows that the element denoted thereby is a lower-arm element belonging to the lower arm. Some of elements are denoted by reference numerals having additional H's and L's at the ends thereof to clearly show that the elements are the upper- and lower-arm elements, while others of the elements are denoted by common reference numerals denoting both the upper-arm elements and the lower-arm elements.

The sealing resin body 11 is made of, e.g., an epoxy-based resin. The sealing resin body 11 is formed by, e.g., a transfer mold method or the like. The sealing resin body 11 has a generally rectangular two-dimensional shape and has a one surface 11a perpendicular to the Z-direction, a back surface 11b opposite to the one surface 11a, and side surfaces connecting the one surface 11a and the back surface 11b. The one surface 11a and the back surface 11b are, e.g., planar surfaces. The sealing resin body 11 has, as the side surfaces thereof, a side surface 11c from which the main terminals 22, 23, and 24 protrude and a side surface 11d from which the signal terminals 25 protrude.

Each of the semiconductor chips 12 includes a semiconductor substrate made of silicon or the like and a power transistor, such as an insulated-gate bipolar transistor (IGBT), formed in the substrate. In the present embodiment, an n-channel IGBT and a flywheel diode (FWD) connected in anti-parallel to the IGBT are formed. That is, in the semiconductor chip 12, an RC (Reverse Conducting)-IGBT is formed. The semiconductor chip 12 has a generally rectangular two-dimensional shape.

The IGBT and the FWD have a vertical structure to allow a current to flow in the Z-direction. In the thickness direction of each of the semiconductor chips 12, i.e., in the Z-direction, a collector electrode 13a is formed on a one surface 12a, while an emitter electrode 13b is formed on a back surface 12b opposite to the one surface 12a. The collector electrode 13a serves also as the cathode electrode of the FWD, while the emitter electrode 13b serves also as the anode electrode of the FWD. On the back surface 12b of the semiconductor chip 12, i.e., the surface thereof where the emitter electrode is formed, pads (the illustration thereof is omitted) including a pad for a gate electrode are formed. The semiconductor chip 12 corresponds to an electronic component.

The semiconductor chips 12 include upper-arm semiconductor chips 12H and lower-arm semiconductor chips 12L. Each of the semiconductor chips 12H and 12L has substantially the same two-dimensional shapes, specifically, generally rectangular two-dimensional shapes, substantially the same sizes, and substantially the same thicknesses. The semiconductor chips 12H and 12L are disposed such that the respective collector electrodes 13a thereof are on the same side of the semiconductor chips 12H and 12L in the Z-direction, and the respective emitter electrodes 13b thereof are on the same side of the semiconductor chips 12H and 12L in the Z-direction. The semiconductor chips 12H and 12L are disposed at substantially the same heights in the Z-direction, while being arranged side by side in the X-direction.

Each of the first heat sinks 14 has the function of dissipating heat in the corresponding semiconductor chip 12 to the outside of the semiconductor device 10 and also has the function of a wire. Accordingly, to ensure a thermal conductivity and an electrical conductivity, the first heat sink 14 is formed using at least a metal material. The first heat sink 14 is referred to also as a heat dissipation member. In the present embodiment, the first heat sink 14 is provided so as to include the corresponding semiconductor chip 12 in a projected view along the Z-direction.

Each of the first heat sinks 14 is electrically connected to the collector electrode 13a of the corresponding semiconductor chip 12 via a solder 15. The major part of the first heat sink 14 is covered with the sealing resin body 11. Of the surfaces of the first heat sink 14, a heat dissipation surface 14a opposite to the semiconductor chip 12 is exposed from the sealing resin body 11. Specifically, the heat dissipation surface 14a is generally flush with the one surface 11a. Of the surfaces of the first heat sink 14, the portions other than the portion connected to the solder 15 and the heat dissipation surface 14a are covered with the sealing resin body 11.

In the present embodiment, the first heat sinks 14 include an upper-arm first heat sink 14H and a lower-arm first heat sink 14L. Also, the solders 15 include an upper-arm solder 15H and a lower-arm solder 15L. The first heat sink 14H is connected to the collector electrode 13a of the semiconductor chip 12H via the solder 15H. On the other hand, the first heat sink 14L is connected to the collector electrode 13a of the semiconductor chip 12L via the solder 15L. The first heat sinks 14H and 14L are disposed to be arranged in the X-direction, while being disposed at substantially the same positions in the Z-direction. The respective heat dissipation surfaces 14a of the first heat sinks 14H and 14L are exposed from the one surface 11a of the sealing resin body 11, while being arranged in the X-direction.

As shown in FIGS. 3 and 4, the joint part 16 is continued to the lower-arm first heat sink 14L. The joint part 16 is the portion serving as an electrical relay between the first heat sink 14L and a second heat sink 19H described later. In the present embodiment, the joint part 16 is provided integrally with the first heat sink 14L by processing the same metal plate. The joint part 16 is provided thinner than the first heat sink 14L so as to be covered with the sealing resin body 11. The joint part 16 is continued to the first heat sink 14L to be generally flush with the surface of the first heat sink 14L which is closer to the semiconductor chip 12H. The joint part 16 extends from around one end of the first heat sink 14L in the Y-direction toward the second heat sink 19H. In the present embodiment, as shown in FIG. 4, the joint part 16 has two bent portions.

Each of the terminals 17 is interposed between the corresponding semiconductor chip 12 and the corresponding second heat sink 19. The terminal 17, which is located on a thermal and electrical conduction path between the semiconductor chip 12 and the second heat sink 19, is formed using at least a metal material (e.g., Cu) so as to ensure a thermal conductivity and an electrical conductivity. The terminal 17 is disposed to face the emitter electrode 13b and electrically connected to the emitter electrode 13b via a solder 18.

In the present embodiment, the terminals 17 include upper-arm terminals 17H and lower-arm terminals 17L. Also, the solders 18 include upper-arm solders 18H and lower-arm solders 18L. Each of the terminals 17H is connected to the emitter electrode 13b of the semiconductor chip 12H via the solder 18H. Each of the terminals 17L is connected to the emitter electrode 13b of the semiconductor chip 12L via the solder 18L.

Each of the second heat sinks 19 has the function of dissipating heat in the corresponding semiconductor chip 12 to the outside of the semiconductor device 10 and also has the function of a wire. Accordingly, to ensure a thermal conductivity and an electrical conductivity, the second heat sink 19 is formed using at least a metal material, similarly to the first heat sink 14. The second heat sink 19 is referred to also as a heat dissipation member. In the present embodiment, the second heat sink 19 is provided so as to include the corresponding semiconductor chip 12 in a projected view along the Z-direction.

The second heat sink 19 is electrically connected to the emitter electrode 13b of the corresponding semiconductor chip 12. Specifically, the second heat sink 19 is electrically connected to the emitter electrode 13b via the solder 18, the terminal 17, and a solder 20. The major part of the second heat sink 19 is covered with the sealing resin body 11. Among the surfaces of the second heat sink 19, a heat dissipation surface 19a opposite to the semiconductor chip 12 is exposed from the sealing resin body 11. Specifically, the heat dissipation surface 19a is generally flush with the back surface 11b. Of the surfaces of the second heat sink 19, the portions other than the portion connected to the solder 20 and the heat dissipation surface 19a are covered with the sealing resin body 11. The second heat sink 19 corresponds to a conductive member other than external connection terminals.

In the present embodiment, the second heat sinks 19 include the upper-arm second heat sink 19H and a lower-arm second heat sink 19L. Also, the solders 20 include an upper-arm solder 20H and a lower-arm solder 20L. The second heat sink 19H and the terminal 17H are connected via the solder 20H. Also, the second heat sink 19L and the terminal 17L are connected via the solder 20L. The second heat sinks 19H and 19L are disposed to be arranged in the X-direction and are disposed at substantially the same positions in the Z-direction. Also, the respective heat dissipation surfaces 19a of the second heat sinks 19H and 19L are exposed from the back surface 11b of the sealing resin body 11, while being arranged in the X-direction.

As shown in FIG. 3, the second heat sinks 19H and 19L have the same shape. The second heat sink 19H and the second heat sink 19L are disposed so as to achieve two-fold symmetry. The second heat sink 19 has a generally L shape in a plan view and includes a main body part 190 connected to the corresponding terminal 17 via the solder 20 and an extending part 191 extending from the main body part 190.

The extending part 191 is provided integrally with the main body part 190 by processing the same metal plate. The extending part 191 is provided thinner than the main body part 190 so as to be covered with the sealing resin body 11. The extending part 191 is continued to the main body part 190 so as to be generally flush with the surface of the main body part 190 which is closer to the semiconductor chip 12. The second heat sink 19 is disposed such that the extending direction of the extending part 191 extends along the X-direction.

In the present embodiment, each of the second heat sinks 19 has, as the main body part 190, an upper-arm main body part 190H and a lower-arm main body part 190L. Also, each of the second heat sinks 19 has, as the extending part 191, an upper-arm extending part 191H and a lower-arm extending part 191L. The two second heat sinks 19H and 19L are disposed such that, in the X-direction, the extending part 191H faces the main body part 190L, and the extending part 191L faces the main body part 190H. In other words, the two second heat sinks 19H and 19L are disposed such that the extending parts 191H and 191L are arranged side by side in the Y-direction.

The extending part 191H overlaps the tip portion of the joint part 16 in a projected view along the Z-direction. The extending part 191H and the joint part 16 are connected via a solder 21.

The main terminal 22 is connected to the higher-potential power source line 5. Accordingly, the main terminal 22 is referred to also as a higher-potential power source terminal or a P-terminal. The main terminal 22 is electrically connected to the first heat sink 14H to extend in the Y-direction and protrude to the outside from the side surface 11c of the sealing resin body 11. In the present embodiment, the main terminal 22 is provided integrally with the first heat sink 14H by processing the same metal plate. The main terminal 22 is continued to one end of the first heat sink 14H in the Y-direction, and the main terminal 22 and the first heat sink 14H extend in the Y-direction. The main terminal 22 and the first heat sink 14H which are integrally continued to each other correspond to the external connection terminal. When the main terminal 22 is provided as a member separate from the first heat sink 14H, the main terminal 22 corresponds to the external connection terminal.

The main terminal 23 is connected to the output line 7 of the motor 3. Accordingly, the main terminal 23 is referred to also as an output terminal or an O-terminal. The main terminal 23 is electrically connected to the first heat sink 14L to extend in the Y-direction and protrude to the outside from the same side surface 11c as that from which the main terminal 22 protrudes. In the present embodiment, the main terminal 23 is provided integrally with the first heat sink 14L by processing the same metal plate. The main terminal 23 is continued to one end of the first heat sink 14L in the Y-direction, and the main terminal 23 and the first heat sink 14L extend in the Y-direction. The main terminal 23 and the first heat sink 14L which are integrally continued to each other also correspond to the external connection terminal. When the main terminal 23 is provided as a member separate from the first heat sink 14L, the main terminal 23 corresponds to the external connection terminal.

The main terminal 24 is connected to the lower-potential power source line 6. Accordingly, the main terminal 24 is referred to also as a lower-potential power source terminal or an N-terminal. The main terminal 24 is disposed so as to overlap the extending part 191L of the second heat sink 19L in a projected view along the Z-direction. The main terminal 24 is disposed closer to the semiconductor chip 12 than the extending part 191L in the Z-direction. The main terminal 24 and the extending part 191L are also connected via the solder 21, though the illustration thereof is omitted. The main terminal 24 also corresponds to the external connection terminal.

The main terminal 24 extends in the Y-direction to protrude to the outside from the same side surface 11c as that from which the main terminals 22 and 23 protrude. The portions of the main terminals 22, 23, and 24 which are protruding from the sealing resin body 11 are disposed at substantially the same positions in the Z-direction. The main terminals 22, 24, and 23 are disposed to be arranged in this order in the X-direction.

The signal terminals 25 are electrically connected to the pads of the corresponding semiconductor chips 12 via bonding wires 26. In the present embodiment, the aluminum-based bonding wires 26 are used. The signal terminals 25 extend in the Y-direction to protrude to the outside from the side surface 11d of the sealing resin body 11. Specifically, the signal terminals 25 protrude to the outside from the side surface 11d opposite to the side surface 11c from which the main terminals 22, 23, and 24 protrude.

In the present embodiment, the signal terminals 25 include upper-arm signal terminals 25H and lower-arm signal terminals 25L. The signal terminals 25H are connected to the pads of the semiconductor chip 12H, while the signal terminals 25L are connected to the pads of the semiconductor chip 12L.

In the present embodiment, the first heat sinks 14H and 14L, the joint part 16, the main terminals 22, 23, and 24, and the signal terminals 25 are formed of the same metal plate. That is, the lead frame 27 has the first heat sinks 14H and 14L, the joint part 16, the main terminals 22, 23, and 24, and the signal terminals 25.

Note that the semiconductor device 10 in the present embodiment has through holes 28, 29, and 30. The through hole 28 is formed in the main terminal 22 so as to position the lead frame 27 described above. The through hole 28 is formed in the portion of the main terminal 22 which is uncovered with the sealing resin body 11. The through holes 29 are formed in the vicinity of coupling portions between the first heat sinks 14H and 14L and the main terminals 22 and 23 so as to restrict the peeling of the sealing resin body 11. The through holes 29 are filled with the sealing resin body 11. The through holes 30 are formed in the signal terminals 25 so as to restrict the peeling of the sealing resin body 11. The through holes 30 are filled with the sealing resin body 11.

In the semiconductor device 10 thus configured, the sealing resin body 11 integrally seals the semiconductor chips 12, respective portions of the first heat sinks 14, the joint part 16, the terminals 17, respective portions of the second heat sinks 19, respective portions of the main terminals 22, 23, and 24, and respective portions of the signal terminals 25. In the semiconductor device 10, the sealing resin body 11 seals the two semiconductor chips 12H and 12L forming the upper and lower arms corresponding to one phase. Accordingly, the semiconductor device 10 is referred to also as a 2-in-1 package.

The first heat sink 14 and the second heat sink 19 have been subjected to cutting together with the sealing resin body 11. Accordingly, the one surface 11a and the heat dissipation surfaces 14a are cut surfaces. The respective heat dissipation surfaces 14a of the first heat sinks 14H and 14L are located in the same plane and generally flush with the one surface 11a of the sealing resin body 11. Likewise, the back surface 11b and the heat dissipation surfaces 19a are cut surfaces. The respective heat dissipation surfaces 19a of the second heat sinks 19H and 19L are located in the same plane and generally flush with the back surface 11b of the sealing resin body 11. Thus, the semiconductor device 10 has a double-side heat dissipation structure in which both of the heat dissipation surfaces 14a and 19a are exposed from the sealing resin body 11.

Figure 5:
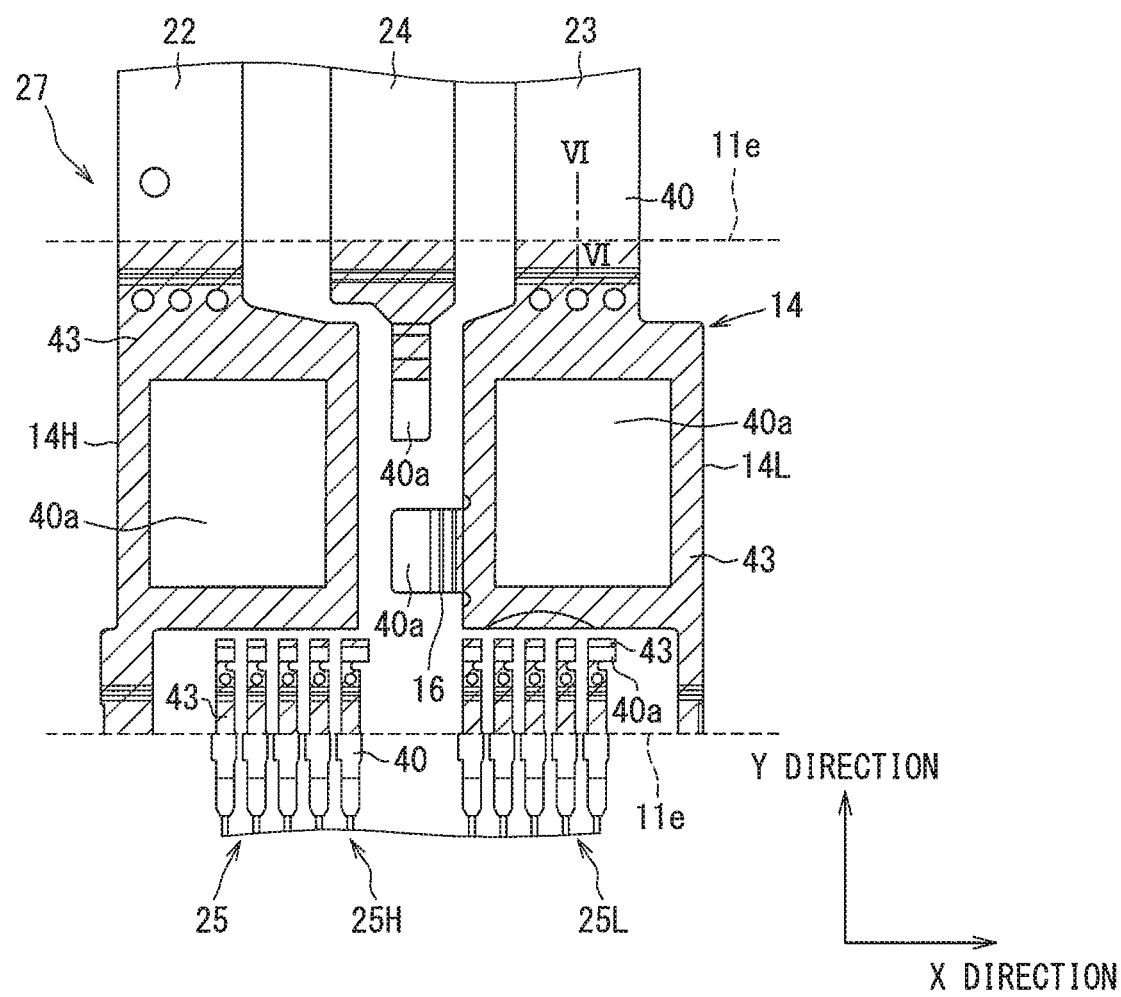
FIG. 5 is a plan view of a lead frame of the semiconductor device according to the first embodiment.
Figure 6:
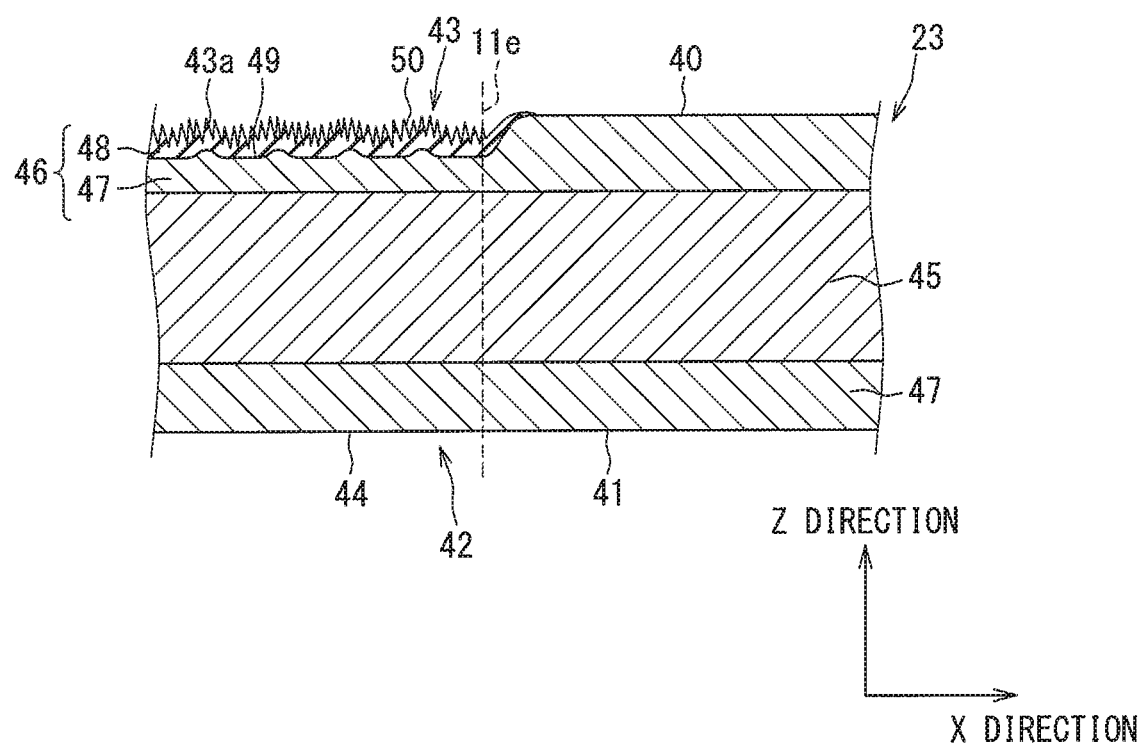
FIG. 6 is a cross-sectional view along the line VI-VI in FIG. 5.
Figure 7:
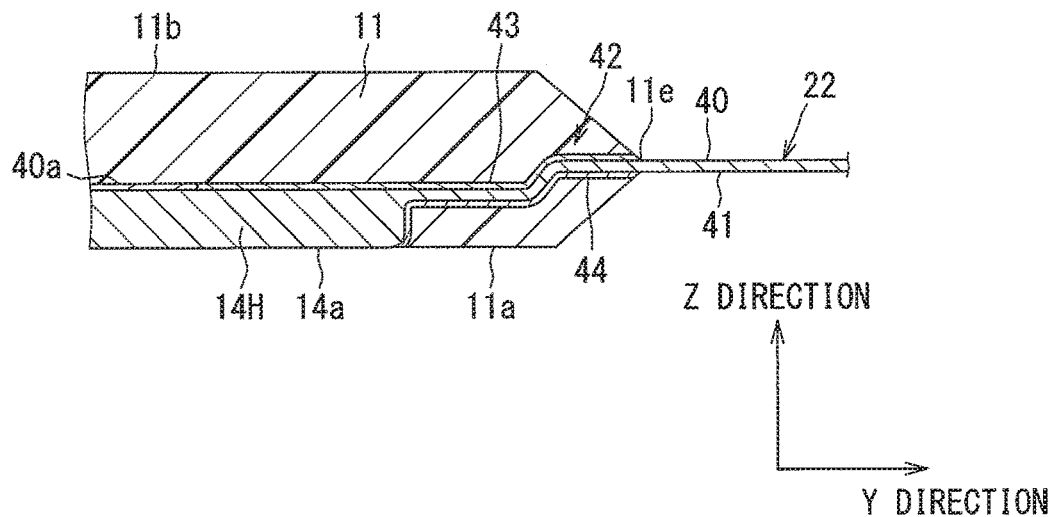
FIG. 7 is a cross-sectional view along the line VII-VII in FIG. 2.
Figure 8:
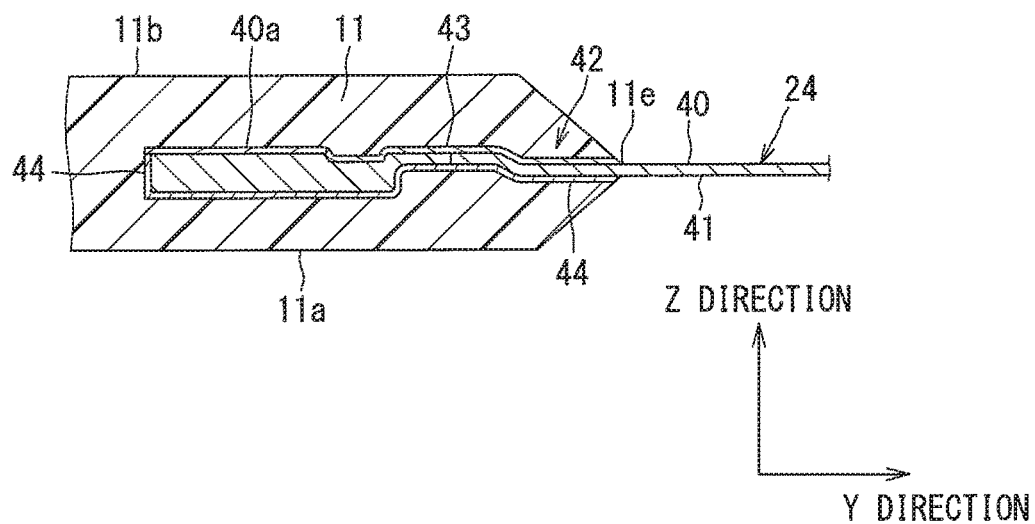
FIG. 8 is a cross-sectional view along the line VIII-VIII in FIG. 2.
Figure 9:
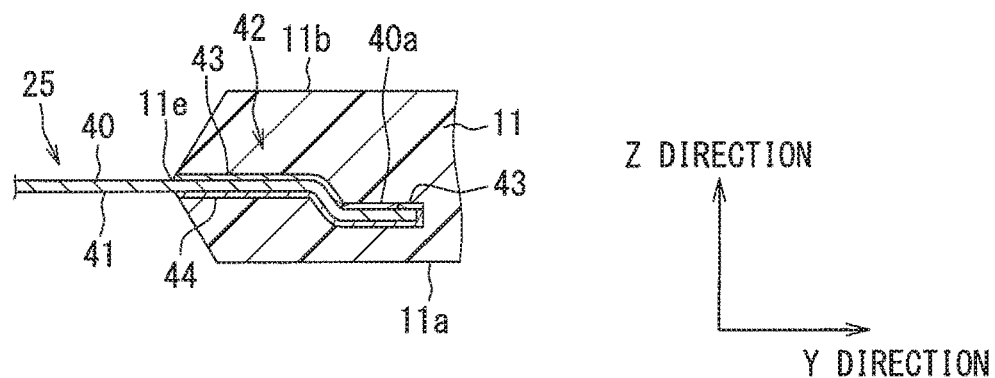
FIG. 9 is a cross-sectional view along the line IX-IX in FIG. 2.

Next, a description will be given of a detailed structure of each of the external connection terminals on the basis of FIGS. 5 to 9. FIG. 5 shows the lead frame 27 in the semiconductor device 10. FIG. 5 is a plan view but, for improved clarity of illustration, a higher adhesion part 43 described later is hatched. In FIGS. 5 and 6, to clearly show positional relations, an outer peripheral end 11e of the sealing resin body 11 is shown by the broken line. In FIG. 7, for the sake of convenience, the depiction of the semiconductor chip 12H, the solders 15H, 18H, and 20H, the terminal 17H, and the second heat sink 19H (main body part 190H) is omitted. In FIG. 8, for the sake of convenience, the depiction of the second heat sink 19L (extending part 191L) and the solder 21 is omitted. In FIG. 9, for the sake of convenience, the depiction of the bonding wires 26 is omitted.

As described above, the lead frame 27 has the first heat sinks 14H and 14L, the joint part 16, the main terminals 22, 23, and 24, and the signal terminals 25. Specifically, the lead frame 27 has the external connection terminal including the first heat sink 14H and the main terminal 22, the external connection terminal including the first heat sink 14L and the main terminal 23, the main terminal 24 serving as the external connection terminal, and the signal terminals 25 similarly serving as the external connection terminals.

The lead frame 27 has a connection surface 40 and a back surface 41 opposite to the connection surface 40 in the Z-direction. Each of the external connection terminals has a connected part 40a electrically connected to the semiconductor chip 12 in the connection surface 40. In the external connection terminal including the main terminal 22, the first heat sink 14H has the connected part 40a and, to the connected part 40a, the collector electrode 13a of the semiconductor chip 12H is connected via the solder 15H. In the external connection terminal including the main terminal 23, the first heat sink 14L has the connected part 40a and, to the connected part 40a, the collector electrode 13a of the semiconductor chip 12L is connected via the solder 15L. To the first heat sink 14L, the joint part 16 is continued, and the joint part 16 also has the connected part 40a. To the connected part 40a of the joint part 16, the second heat sink 19H is connected via the solder 21. That is, the connected part 40a of the joint part 16 is electrically connected to the emitter electrode 13b of the semiconductor chip 12H.

To the connected part 40a of the main terminal 24, the second heat sink 19L is connected via the solder 21. That is, the connected part 40a of the main terminal 24 is electrically connected to the emitter electrode 13b of the semiconductor chip 12L. To the respective connected parts 40a of the signal terminals 25, one ends of the bonding wires 26 are connected. That is, the connected parts 40a of the signal terminals 25 are electrically connected to the pads of the corresponding semiconductor chips 12.

Each of the external connection terminals has, as a portion of the surface thereof, a covered part 42 which is the portion other than the connected part 40a and covered with the sealing resin body 11. The external connection terminal has, as the covered part 42, the higher adhesion part 43 having a higher adhesion to the sealing resin body 11 and a lower adhesion part 44 having an adhesion to the sealing resin body 11 which is lower than that of the higher adhesion part 43. In the present embodiment, of the higher adhesion part 43 and the lower adhesion part 44, only the higher adhesion part 43 has a roughened surface 43a. In other words, the lower adhesion part 44 is not roughened. In the present embodiment, the roughened surface 43a is obtained by forming an uneven oxide film 48 described later by laser beam irradiation.

Specifically, each of the external connection terminals (lead frame 27) has a base material 45 formed using a metal material and a coated film 46 formed on the surface of the base material 45 to correspond to at least the higher adhesion part 43. In the present embodiment, as the material of the base material 45, Cu is used.

The coated film 46 has a metal thin film 47 and the uneven oxide film 48. The metal thin film 47 contains a metal as a constituent material. The metal thin film 47 is formed on the surface of the base material 45 which is closer to the connection surface 40. In the present embodiment, the metal thin film 47 is formed also on the surface of the base material 45 which is closer to the back surface 41. The metal thin film 47 is formed on the portion of the lead frame 27 which is other than the heat dissipation surface 14a of the first heat sink 14 and the end surfaces of the portions thereof from which tie bars have been removed. From the heat dissipation surface 14a, the metal thin film 47 has been removed by a cutting process.

The metal thin film 47 is formed by, e.g., plating or vapor deposition. For the metal thin film 47, a configuration including a film containing Ni as a main component is preferable. More preferably, a configuration including an electroless Ni plating film is used. The electroless Ni plating film contains P (phosphorus) in addition to Ni as the main component.

As long as conditions for the laser beam irradiation described later are the same, the uneven oxide film 48 formed from the electroless Ni plating film is thicker than the uneven oxide film 48 formed from an electroplated Ni film. The melting point of the electroless Ni plating film (Ni—P) is about 800 degrees (° C.), though the melting point varies depending on the content of P. On the other hand, the melting point of the electroplated Ni film (Ni) is about 1450 degrees (° C.). It can be considered that, since the electroless Ni plating film thus has the lower melting point, the electroless Ni plating film is melted and evaporated with a lower-energy laser beam, and consequently the uneven oxide film 48 is thicker.

In the surface of the metal thin film 47, as shown in FIG. 6, a plurality of depressed portions 49 are locally formed. As will be described later, the depressed portions 49 are formed by irradiation with a pulse oscillation laser beam. For example, each one of the depressed portions 49 is formed for each one pulse. The depressed portions 49 correspond to laser beam spots. In addition, in the direction in which the laser beam is scanned, the adjacent depressed portions 49 are consecutive. Each of the depressed portions 49 has a width of 5 μm to 300 μm. The depth of the depressed portion 49 is 0.5 μm to 5 μm.

When the depth of the depressed portion 49 is smaller than 0.5 μm, the melting and vapor deposition of the surface of the metal thin film 47 caused by the laser beam irradiation is insufficient so that the uneven oxide film 48 is less likely to be formed. When the depth of the depressed portion 49 is larger than 5 μm, the surface of the metal thin film 47 is more likely to be melted and scattered. Consequently, in surface formation, melting and scattering is dominant over vapor deposition, and the uneven oxide film 48 is less likely to be formed.

Over the depressed portions 49 in the surface of the metal thin film 47, the uneven oxide film 48 is formed. As described above, the depressed portions 49 are a mark left by the laser beam irradiation. The portion of the metal thin film 47 where the uneven oxide film 48 is formed has an average thickness smaller than the average thickness of the portion thereof where the uneven oxide film 48 is not formed. Thus, the smaller average thickness of the portion of the metal thin film 47 where the uneven oxide film 48 is formed is also a mark left by the laser beam irradiation.

The uneven oxide film 48 is made of an oxide of the same metal as that forming the metal thin film 47 as a main component. The uneven oxide film 48 has a surface with consecutive depressions and projections. The uneven oxide film 48 is formed on the metal thin film 47. The uneven oxide film 48 is formed by irradiating the metal thin film 47 with a pulse oscillation laser beam and oxidizing the metal forming the metal thin film 47. In other words, the uneven oxide film 48 is a film of an oxide formed in the surface of the metal thin film 47 by oxidizing the surface layer of the metal thin film 47. Accordingly, it can also be said that a portion of the metal thin film 47 provides the uneven oxide film 48. In the present embodiment, $Ni_2O_3$ accounts for 80% of the components forming the uneven oxide film 48, NiO accounts for 10% thereof, and Ni accounts for 10% thereof. Thus, the main component of the uneven oxide film 48 is the oxide of Ni contained in the metal thin film 47.

The uneven oxide film 48 is formed over the surfaces of the depressed portions 49 of the surface of the metal thin film 47. The average thickness of the uneven oxide film 48 is ten to several hundreds of nanometers. The uneven oxide film 48 is formed conformally along the depressions and projections of the surface of the metal thin film 47 having the depressed portions 49. The depressions and projections are formed with a pitch finer than the width of each of the depressed portions 49. That is, the extremely minute depressions and projections are formed. In other words, a plurality of projecting portions 50 (columnar bodies) are formed with a fine pitch. For example, the average width of the projecting portions 50 is 1 nm to 300 nm, and the average interval between the projecting portions 50 is 1 nm to 300 nm.

In the external connection terminal including the main terminal 22 (P-terminal), as shown in FIGS. 5 and 7, the entire portion of the connection surface 40 which is located between the outer peripheral end 11e and the connected part 40a serves as the higher adhesion part 43. The higher adhesion part 43 surrounds the connected part 40a. Specifically, of the surface of the first heat sink 14H closer to the semiconductor chip 12H, the entire portion except for the connected part 40a serves as the higher adhesion part 43. On the other hand, of the back surface 41, the portion except for the heat dissipation surface 14a serves as the lower adhesion part 44. Of the covered part 42, the side surface portion of the lead frame 27 also serves as the lower adhesion part 44.

The external connection terminal including the main terminal 23 (O-terminal) also has the same configuration as that of the external connection terminal including the main terminal 22. Accordingly, a cross-sectional view thereof is omitted. Of the connection surface 40, the entire portion located between the outer peripheral end 11e and the connected part 40a serves as the higher adhesion part 43. The higher adhesion part 43 surrounds the connected part 40a. On the other hand, of the back surface 41, the portion except for the heat dissipation surface 14a serves as the lower adhesion part 44. Of the covered part 42, the side surface portion of the lead frame 27 also serves as the lower adhesion part 44.

In the main terminal 24 (N-terminal), as shown in FIGS. 5 and 8, of the connection surface 40, the entire portion located between the outer peripheral end 11e and the connected part 40a serves as the higher adhesion part 43. Of the main terminal 24, the portion closer to one end thereof in the Y-direction serves as the connected part 40a. On the other hand, the entire back surface 41 serves as the lower adhesion part 44. Of the covered part 42, the side surface portion of the lead frame 27 also serves as the lower adhesion part 44.

In the signal terminal 25, as shown in FIGS. 5 and 9, of the connection surface 40, the entire portion located between the outer peripheral end 11e and the connected part 40a serves as the higher adhesion part 43. Also, of the connection surface 40, the entire portion located between the end portion thereof closer to the corresponding semiconductor chip 12 and the connected part 40a serves as the higher adhesion part 43. That is, in the Y-direction, the connected part 40a is interposed between the higher adhesion parts 43. On the other hand, the entire back surface 41 serves as the lower adhesion part 44. Of the covered part 42, the side surface portion of the lead frame 27 also serves as the lower adhesion part 44.

Note that the semiconductor device 10 described above can be formed by the manufacturing method shown below.

First, the individual components of the semiconductor device 10 are prepared. That is, each of the lead frame 27 including the first heat sinks 14, the joint part 16, the main terminals 22, 23, and 24, and the signal terminals 25, the terminals 17, and the second heat sinks 19 is prepared. In the preparation step, the lead frame 27 in which the metal thin film 47 is formed on the surface of the base material 45 is prepared. In the present embodiment, the lead frame 27 in which an electroless Ni plating film is formed as the metal thin film 47 is prepared. At this time, the thickness of the electroless Ni film is set to about 10 μm.

Next, the uneven oxide film 48 is formed by laser beam irradiation. By irradiating the portion of the surface of the metal thin film 47 where the higher adhesion part 43 is to be formed with a pulse oscillation laser beam, the surface of the metal thin film 47 is melted and evaporated. Specifically, by the laser beam irradiation, the surface portion of the metal thin film 47 is melted and evaporated (vaporized) to float in ambient air. A pulse oscillation laser beam is adjusted such that the energy density thereof is more than 0 $J/cm^2$ and 100 $J/cm^2$ or less, and the pulse width thereof is 1 microsecond or less. To satisfy the conditions, a YAG laser, a $YVO_4$ laser, a fiber laser, or the like can be used. For example, in the case of using the YAG laser, it is sufficient for the energy density to be 1 $J/cm^2$ or more. In the case of using electroless Ni plating, the metal thin film 47 can be processed even when the energy density is about 5 $J/cm^2$. Note that the energy density is referred to also as pulse fluence.

At this time, by relatively moving the light source of the laser beam and the lead frame 27, the laser beam is successively applied to the regions where the higher adhesion parts 43 are to be formed. For example, the laser beam is scanned to be applied to lattice points with a predetermined pitch in XY-coordinates. Alternatively, the laser beam is scanned in the X-direction such that adjacent laser beam spots (irradiation range corresponding to one pulse) partially overlap in the X-direction. Also, the laser beam is scanned in the Y-direction such that the adjacent laser beam spots partially overlap in the Y-direction. By thus applying the laser beam and melting and evaporating the surface of the metal thin film 47, the depressed portions 49 are formed in the surface of the metal thin film 47. The portion of the metal thin film 47 which is irradiated with the laser beam has an average thickness smaller than the average thickness of the portion of the metal thin film 47 which is not irradiated with the laser beam. The plurality of depressed portions 49 formed to correspond to the laser beam spots are consecutive in the X-direction and also consecutive in the Y-direction. As a result, the depressed portions 49 as a mark left by the laser irradiation have, e.g., a scaly pattern.

Next, the melted portion of the metal thin film 47 is solidified. Specifically, the melted and evaporated metal thin film 47 is vapor-deposited on the portion irradiated with the laser beam and the peripheral portion thereof. By thus vapor-depositing the melted and evaporated metal thin film 47, the uneven oxide film 48 is formed on the surface of the metal thin film 47.

In the laser beam irradiation, when the energy density is set to 150 J/cm$^2$ or 300 J/cm$^2$ higher than 100 J/cm$^2$, the uneven oxide film 48 is not formed. When a continuous oscillation laser beam, not the pulse oscillation laser beam, is applied also, the uneven oxide film 48 is not formed.

Next, the semiconductor chips 12 and the first heat sinks 14 are connected via the solders 15 to form connection bodies. A description will be given using the upper-arm connection body as an example.

First, on the connected part 40a of the connection surface 40 of the first heat sink 14H, the solder 15H is placed and, on the solder 15H, the semiconductor chip 12H is placed. Then, on the semiconductor chip 12H, the terminal 17H having the solder 18H and the solder 20H which are placed in advance as pre-solders on the both surfaces thereof is placed such that the solder 18H is closer to the semiconductor chip 12H. The solder 20H is placed in an amount which allows height variations in the semiconductor device 10 to be absorbed.

Then, in the stacked state, the solders 15H, 18H, and 20H are caused to reflow (1st reflow) to connect the semiconductor chip 12H and the first heat sink 14H via the solder 15H. Also, the semiconductor chip 12H and the terminal 17H are connected via the solder 18H. The second heat sink 19H to which the solder 20H is to be connected has not been prepared yet so that the solder 20H shows a protruding shape having an apex at the center of the facing surface thereof facing the second heat sink 19H under surface tension.

The lower-arm connection body can also be formed similarly to the upper-arm connection body. The formation of the lower-arm connection body is different from that of the upper-arm connection body in that, before being caused to reflow, the solder 21 is placed on the facing surface of the joint part 16 facing the extending part 191H. Similarly to the solder 20, the solder 21 is placed in an amount which allows height variations in the semiconductor device 10 to be absorbed.

Then, the signal terminals 25 and the pads of the corresponding semiconductor chips 12 are connected with the bonding wires 26. For example, by a supersonic bonding method, one ends of the bonding wires 26 are bonded to the connected parts 40a of the signal terminals 25. In other words, the bonding wires 26 and the metal thin film 47 are bonded together. Thus, the semiconductor chips 12 and the signal terminals 25 are electrically connected via the bonding wires 26.

Then, the connection bodies described above and the corresponding second heat sinks 19 are connected via the solders 20. Also, the upper-arm connection bodies and the lower-arm connection bodies are connected via the solders 21. Also, the main terminal 24 and the extending part 191L are connected via the solder 21. That is, the solders 20 and 21 are simultaneously caused to reflow (2nd reflow).

First, the second heat sinks 19H and 19L are placed over a seat not shown such that the heat dissipation surfaces 19a face downward. At this time, on the extending part 191L of the second heat sink 19L, e.g., a solder foil is placed as the solder 21. The solder 21 is also placed in an amount which allows height variations in the semiconductor device 10 to be absorbed. Note that a solder may also be placed in advance as a pre-solder on the main terminal 24.

Next, the connection bodies are placed on the second heat sinks 19H and 19L such that the terminals 17H and 17L face the corresponding second heat sinks 19H and 19L. One of the solders 21 is interposed between the joint part 16 and the extending part 191H. The other of the solders 21 is interposed between the extending part 191L and the main terminal 24.

Then, with the second heat sinks 19H and 19L facing downward, the 2nd reflow is performed. In the 2nd reflow, a load is applied to the first heat sinks 14H and 14L to allow the semiconductor device 10 to have a predetermined height. Specifically, spacers not shown are disposed between the main body parts 190H and 190L of the second heat sinks 19H and 19L and the seat, and the main body parts 190H and 190L and the seat are brought into contact with the spacers. Thus, the semiconductor device 10 is allowed to have the predetermined height.

As described above, between the terminals 17H and 17L and the second heat sinks 19H and 19L, the solders 20H and 20L are placed in amounts which allow height variations be absorbed. Consequently, in the 2nd reflow, there is no shortage of the solders 20H and 20L between the terminals 17H and 17L and the second heat sinks 19H and 19L to allow reliable connection to be provided therebetween. Also, between the extending part 191H and the joint part 16, the solder 21 is placed in an amount which allows height variations to be absorbed. Consequently, in the 2nd reflow, there is no shortage of the solder 21 between the extending part 191H and the joint part 16 to allow reliable connection to be provided therebetween. Also, between the extending part 191L and the main terminal 24, the solder 21 is placed in an amount which allows height variations to be absorbed. Consequently, in the 2nd reflow, there is no shortage of the solder 21 between the extending part 191L and the main terminal 24 to allow reliable connection to be provided therebetween.

Note that each of the first reflow and the second reflow is assumed to be a reflow performed in a hydrogen atmosphere. Accordingly, a natural oxide film on the metal surface which is unneeded for soldering can be removed by reduction. This allows a fluxless solder to be used as each of the solders 15, 18, 20, and 21. In addition, it is possible to restrict voids from being formed in the solders 15, 18, 20, and 21 by pressure reduction. Note that, since the thickness of the uneven oxide film 48 is also reduced by reduction, the uneven oxide film 48 having an intended thickness is formed by laser beam irradiation such that the uneven oxide film 48 remains even when reduced. As described above, when the metal thin film 47 includes the electroless Ni plating film, the uneven oxide film 48 thicker than when the metal thin film 47 includes an electroplated Ni film can favorably be formed.

Then, by a transfer mold method, the sealing resin body 11 is molded. In the present embodiment, the sealing resin body 11 is molded so as to completely cover the first heat sinks 14 and the second heat sinks 19. In this case, the molded sealing resin body 11 is cut together with respective portions of the first heat sinks 14 and the second heat sinks 19 to expose the heat dissipation surfaces 14a and 19a of the first heat sink 14 and the second heat sink 19. Accordingly, the heat dissipation surfaces 14a and 19a are cut surfaces. In addition, the one surface 11a and the back surface 11b of the sealing resin body 11 are also cut surfaces. Also, the heat dissipation surfaces 14a are generally flush with the one surface 11a, while the heat dissipation surfaces 19a are generally flush with the back surface 11b.

Note that the sealing resin body 11 may also be molded in a state where the heat dissipation surfaces 14a and 19a of the first heat sinks 14 and the second heat sinks 19 are pressed against the cavity wall surface of a mold die in close contact relation thereto. In this case, at the time when the sealing resin body 11 is molded, the heat dissipation surfaces 14a and 19a are exposed from the sealing resin body 11. This eliminates the need for cutting after molding.

Then, by removing the unneeded portions (tie bars) of the lead frame 27, the semiconductor device 10 can be obtained.

Next, a description will be given of the effects of the semiconductor device 10 described above.

In the present embodiment, each of the external connection terminals has, as a portion of the surface thereof, the covered part 42 which is other than the connected part 40a and covered with the sealing resin body 11. The external connection terminal also has, as the covered part 42, the higher adhesion part 43 having a higher adhesion to the sealing resin body 11 and the lower adhesion part 44 having an adhesion to the sealing resin body 11 which is lower than that of the higher adhesion part 43.

The higher adhesion part 43 has the roughened surface 43a made of the uneven oxide film 48. Since the uneven oxide film 48 has the surface with depressions and projections, the contact area between the uneven oxide film 48 and the sealing resin body 11 is increased. In addition, the sealing resin body 11 clings to the depressions and projections of the uneven oxide film 48 to cause an anchoring effect. This allows the higher adhesion part 43 to have a higher adhesion to the sealing resin body 11. Between the higher adhesion part 43 and the sealing resin body 11, a solid connection structure is formed. On the other hand, a roughening process is not performed on the lower adhesion part 44. Accordingly, the lower adhesion part 44 has an adhesion to the sealing resin body 11 which is lower than that of the higher adhesion part 43. Between the lower adhesion part 44 and the sealing resin body 11, a connection structure is formed, which is weaker than the connection structure formed between the higher adhesion part 43 and the sealing resin body 11.

Figure 10:
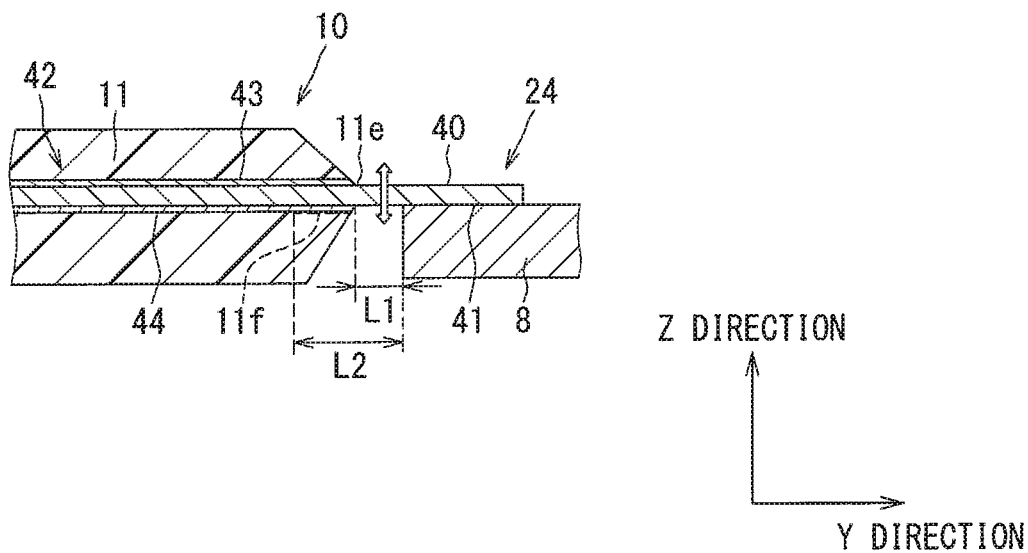
FIG. 10 is a cross-sectional view for illustrating an effect in the event of vibration.

FIG. 10 shows a connection structure between the main terminal 24 as the external connection terminal and a bus bar 8. By way of example, the following will describe the main terminal 24. In FIG. 10, the main terminal 24 is illustrated in a simplified manner. As shown in FIG. 10, in the power conversion device 1, the main terminal 24 is welded to the bus bar 8 and electrically connected to a smoothing capacitor 4 via the bus bar 8. In the state before the main terminal 24 vibrates, the shortest distance between the portion of the main terminal 24 which is fixed to the bus bar 8 and the portion of the main terminal 24 which is fixed by the sealing resin body 11 is a distance L1 from the end portion of the bus bar 8 closer to the semiconductor device 10 to the outer peripheral end 11e in the Y-direction. Note that, in FIG. 10, the bus bar 8 is joined to the back surface 41, but the bus bar 8 may also be joined to the connection surface 40.

When a thermal stress based on the vibration of a vehicle or a linear expansion coefficient difference or the like is exerted on the main terminal 24 via the bus bar 8, as shown by the blank arrow in FIG. 10, the main terminal 24 vibrates in the thickness direction thereof, i.e., in the Z-direction. When the main terminal 24 vibrates, the sealing resin body 11 peels from at least a portion of the lower adhesion part 44 extending from the outer peripheral end 11e. A reference numeral 11f denotes a peeled part of the covered part 42 of the main terminal 24 from which the sealing resin body 11 has peeled. In the present embodiment, of the lower adhesion part 44 of the back surface 41, a local range extending from the outer peripheral end 11e in the Y-direction corresponds to the peeled part 11f.

In the peeled part 11f, the back surface 41 of the main terminal 24 is released from a restriction placed by the sealing resin body 11. The peeling of the sealing resin body 11 elongates the distance between the portion fixed to the bus bar and the portion fixed by the sealing resin body 11, i.e., the distance over which the main terminal 24 can substantially vibrate. Specifically, the distance over which the main terminal 24 can vibrate is a distance L2 from the end portion of the bus bar 8 closer to the semiconductor device 10 to the end portion of the peeled part 11f opposite to the outer peripheral end 11e in the Y-direction. Thus, the portion from which the sealing resin body 11 can peel with vibration when the main terminal 24 vibrates is provided in advance. This can restrict the main terminal 24 from being broken. Note that the same applies also to the external connection terminals other than the main terminal 24. In each of the external connection terminals, a portion from which the sealing resin body 11 can peel with vibration is provided in advance. Therefore, it is possible to restrict the external connection terminal from being broken.

The higher adhesion part 43 and the lower adhesion part 44 of each of the external connection terminals are covered with the sealing resin body 11. Even when the sealing resin body 11 peels from the lower adhesion part 44 with vibration, the peeled part is covered with the sealing resin body 11. Accordingly, a creeping distance remains substantially unchanged. For example, the creeping distance between the main terminal 24 and the main terminal 22 and the creeping distance between the main terminal 24 and the second heat sink 19H before peeling remain substantially unchanged from those after peeling. In the present embodiment, it is not that the distance over which the external connection terminal can substantially vibrate is increased by partly removing the portion covered with the sealing resin body. Therefore, it is possible to ensure the creeping distance.

Thus, it is possible to restrict the external connection terminals from being broken, while ensuring a creeping distance between the conductive members.

In addition to the above, the present embodiment achieves the following effects. In the present embodiment, the lower adhesion part 44 is provided in the back surface 41. This can elongate the distance L2 over which the external connection terminal can vibrate and can also provide a long distance to the connected part 40a, i.e., a so-called leakage path in the extending direction of the external connection terminal even in the event of peeling of the sealing resin body 11. For example, in the case of the main terminal 24, even when peeling occurs in the vicinity of the outer peripheral end 11e, between the peeled part and the connected part 40a in the extending direction, the back surface 41 has a portion where no peeling has occurred and the side surface has a portion where no peeling has occurred.

In the present embodiment, the higher adhesion part 43 is provided in at least a portion of the connection surface 40 which is located between the connected part 40a and the outer peripheral end 11e of the sealing resin body 11 and extending from the connected part 40a. As a result, even when the peeling of the sealing resin body 11 from the connection surface 40 starts at the outer peripheral end 11e, the higher adhesion part 43 can restrict the peeling from extending toward the connected part 40a. In other words, it is possible to restrict moisture or the like from entering the connected part 40a. In particular, in the present embodiment, the higher adhesion part 43 is provided all over the portion between the connected part 40a and the outer peripheral end 11e. This can restrict the peeling from occurring between the outer peripheral end 11e and the connected part 40a. Specifically, it is possible to restrict moisture or the like from entering the connected part 40a from the connection surface 40 where the distance from the outer peripheral end 11e in the extending direction of the external connection terminals is short.

In the present embodiment, in each of the external connection terminal including the main terminal 22 and the external connection terminal including the main terminal 23, the connected part 40a is surrounded by the higher adhesion part 43. This can restrict moisture or the like from entering the connected part 40a from all directions around the connected part 40a.

In the present embodiment, as the higher adhesion part 43, the uneven oxide film 48 forms the roughened surface 43a. As described above, the uneven oxide film 48 is formed by laser beam irradiation. Accordingly, the higher adhesion part 43 can be formed at any position. That is, positional flexibility is high.

The uneven oxide film 48 is made of a metal oxide. Accordingly, wettability with respect to the solders 15 and 21 can be set lower in the higher adhesion part 43 than in the lower adhesion part 44. In addition, minute depressions and projections are formed in the surface of the uneven oxide film 48 to reduce the probability of entrance of the solders 15 and 21 therein. This reduces the contact areas between the uneven oxide film 48 and the solders 15 and 21 so that respective portions of the solders 15 and 21 are formed into spherical shapes under surface tension. That is, contact angles are increased. This can also reduce the wettability with respect to the solders 15 and 21. Specifically, the higher adhesion part 43 (uneven oxide film 48) can restrict the solders 15 and 21 from wet-spreading to the outside of the connected part 40a. In particular, in each of the external connection terminal including the main terminal 22 and the external connection terminal including the main terminal 23, the connected part 40a is surrounded by the higher adhesion part 43. Accordingly, it is possible to effectively restrict the solder 15 from wet-spreading to the outside of the connected part 40a.

By forming the uneven oxide film 48 on the metal thin film 47, it is also possible to restrict the corrosion of the metal thin film 47 and the base material 45. This can also restrict the peeling of the sealing resin body 11 resulting from corrosion.

The thermal stress generated on the basis of the linear expansion coefficient difference between the sealing resin body 11 and each of the signal terminals 25 is concentrated on the end portion of the connection surface 40 of the signal terminal 25 which is closer to the semiconductor chip 12. In the present embodiment, the entire portion of the connection surface 40 of the signal terminal 25 which is located between the end portion thereof closer to the corresponding semiconductor chip 12 and the connected part 40a serves as the higher adhesion part 43. This can restrict the sealing resin body 11 from peeling from the end portion closer to the semiconductor chip 12 and also restrict the peeling of the sealing resin body 11 from extending further to the connected part 40a. Consequently, it is possible to restrict the bonding wire 26 from being broken.

The present inventors performed a terminal bending fatigue test on the main terminal 24 having the configuration described above. At that time, the test was similarly performed on a comparative sample having a configuration not having the lower adhesion part 44, i.e. in which the higher adhesion part 43 was provided even in the back surface 41. The configuration of the comparative sample was the same as the configuration of the main terminal 24 in the present embodiment except for the higher adhesion part 43 and the lower adhesion part 44.

In the terminal bending fatigue test, the main terminal 24 was caused to vibrate such that the portion of the main terminal 24 which was protruding from the sealing resin body 11 and located at a predetermined distance (equivalent to the distance L1) from the outer peripheral end 11e had a predetermined amplitude in the thickness direction, and a load placed on the semiconductor device 10 at this time was measured using a load cell. The main terminal 24 was moved up and down once (one stroke) in one second. The temperature in a measurement environment was set to a high level (115° C.). Then, the number of strokes after which the load abruptly changed was checked. For example, when the predetermined distance mentioned above was 2 mm, in the comparative sample, the load changed abruptly after 13400 strokes. By contrast, with the main terminal 24 in the present embodiment, the load abruptly changed after 45400 strokes, and the peeled part 11f was observed only in a portion of the lower adhesion part 44, i.e., only in a local range extending from the outer peripheral end 11e. Thus, the result of the test has also proved that, in the present embodiment, the breakage of the external connection terminal can be restricted more reliably than in a conventional example.

Note that the roughened surface 43a is not limited to the roughened surface formed of the uneven oxide film 48. Instead of the roughened surface formed of the uneven oxide film 48, e.g., the roughened surface 43a obtained by roughening plating can also be used.

Second Embodiment

For the present embodiment, the previous embodiment can be referred to. Accordingly, a description of components which are common to those of the semiconductor device 10 shown in the previous embodiment is omitted.

Figure 11:
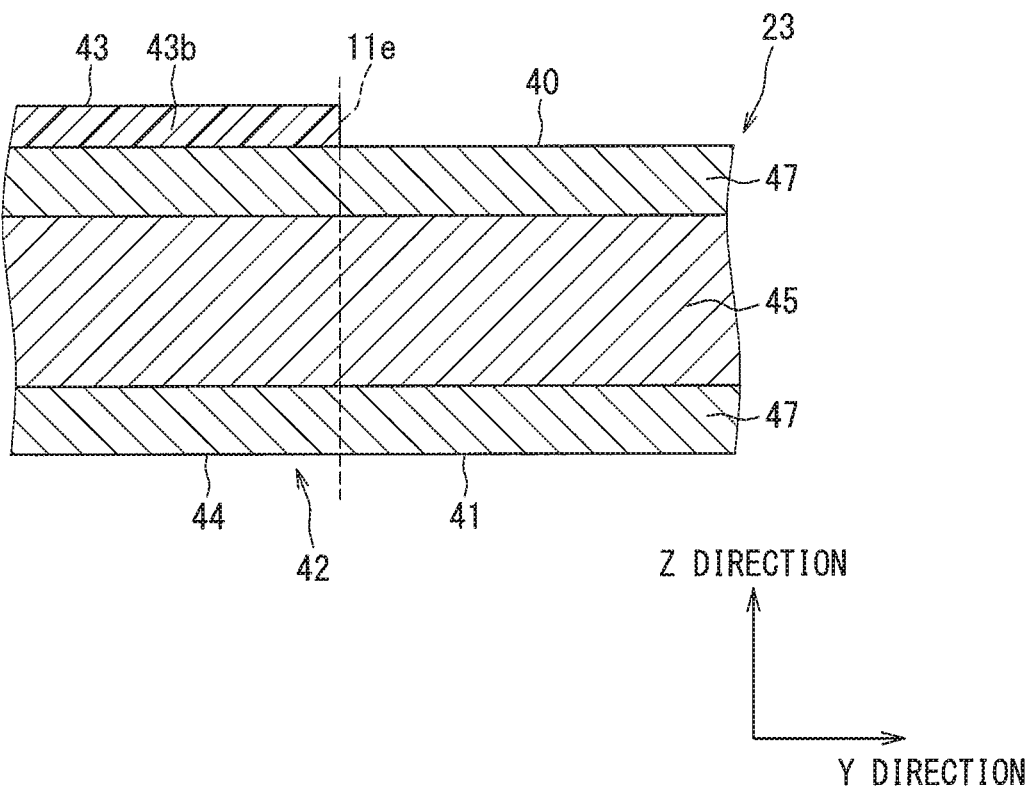
FIG. 11 is a cross-sectional view of an external connection terminal including a main terminal in a semiconductor device according to a second embodiment.

In the present embodiment, as shown in FIG. 11, a polymer film 43b which enhances the adhesion to the sealing resin body 11 is formed in the higher adhesion part 43. FIG. 11 corresponds to FIG. 6 and shows the external connection terminal including the main terminal 23 by way of example.

As the constituent material of the polymer film 43b, a known material such as, e.g., polyamide can be used. Of the covered part 42, the portion where the polymer film 43b is formed serves as the higher adhesion part 43, and the portion where the polymer film 43b is not formed serves as the lower adhesion part 44.

In the lower adhesion part 44, the polymer film 43b is not formed. Accordingly, in the present embodiment also, when the main terminal 23 vibrates, the sealing resin body 11 peels from at least a portion of the lower adhesion part 44 extending from the outer peripheral end 11e. This elongates the distance over which the main terminal 23 can substantially vibrate and can thus restrict the main terminal 23 from being broken. Note that the same applies also to the external connection terminals other than the external connection terminal including the main terminal 23.

Third Embodiment

For the present embodiment, the previous embodiments can be referred to. Accordingly, a description of components which are common to those of the semiconductor device 10 shown in each of the previous embodiments is omitted.

Figure 12:
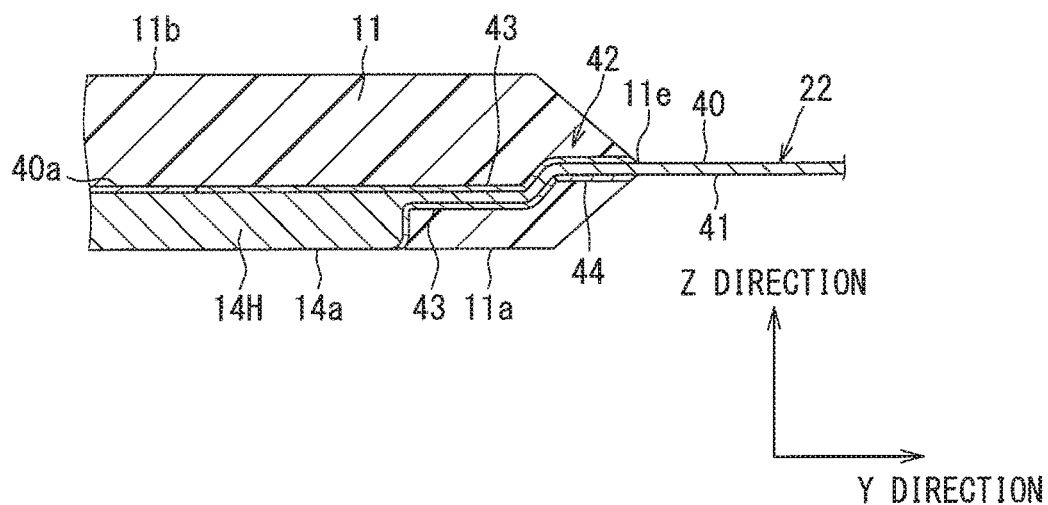
FIG. 12 is a cross-sectional view, which corresponds to FIG. 7, of a semiconductor device according to a third embodiment.

In the present embodiment, as shown in FIG. 12, only a portion of the back surface 41 of the covered part 42 serves as the lower adhesion part 44. In the extending direction of the external connection terminal including the main terminal 22, only a local range extending from the outer peripheral end 11e corresponds to the lower adhesion part 44. The portion between the lower adhesion part 44 and the heat dissipation surface 14a serves as the higher adhesion part 43 having the same configuration as that of the higher adhesion part 43 of the connection surface 40. FIG. 12 corresponds to FIG. 7 and shows the external connection terminal including the main terminal 22 by way of example.

This can allow the lower adhesion part 44 to be formed only in the portion intended to peel. As a result, when the main terminal 22 vibrates, it is possible to control the range in which the sealing resin body 11 peels when the main terminal 22 vibrates, i.e., the distance over which the main terminal 22 can substantially vibrate. Therefore, it is possible to elongate a leakage path to the connected part 40a.

Fourth Embodiment

For the present embodiment, the previous embodiments can be referred to. Accordingly, a description of components which are common to those of the semiconductor device 10 shown in each of the previous embodiments is omitted.

Figure 13:
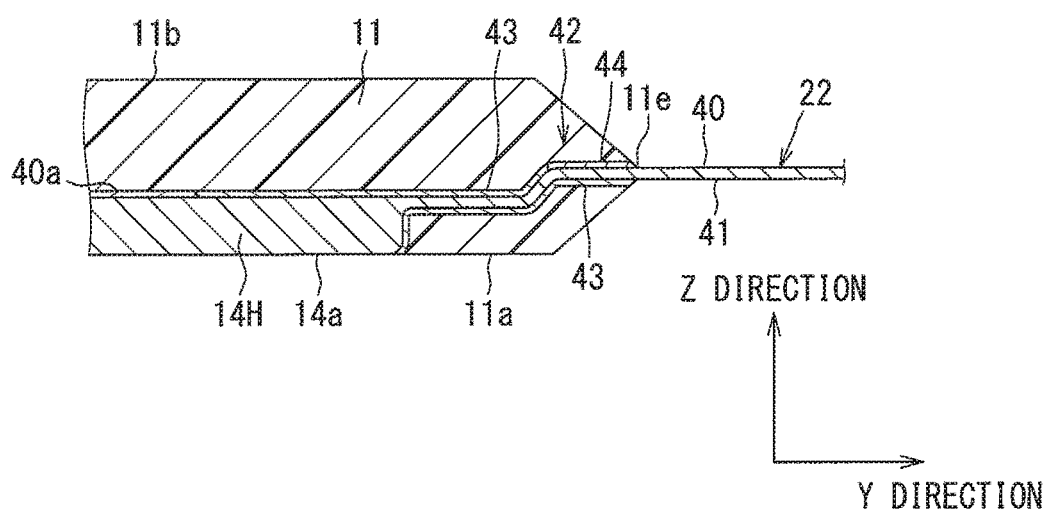
FIG. 13 is a cross-sectional view, which corresponds to FIG. 7, of a semiconductor device according to a fourth embodiment.

In the present embodiment, as shown in FIG. 13, only a portion of the connection surface 40 which is located between the connected part 40a and the outer peripheral end 11e and closer to the connected part 40a serves as the higher adhesion part 43. On the other hand, the portion of the connection surface 40 which is located between the higher adhesion part 43 and the outer peripheral end 11e serves as the lower adhesion part 44. In addition, the covered part 42 of the back surface 41 serves as the higher adhesion part 43. FIG. 13 also corresponds to FIG. 7 and shows the external connection terminal including the main terminal 22 by way of example.

In the case where the lower adhesion part 44 is provided in the connection surface 40 also, when the main terminal 22 vibrates, the sealing resin body 11 peels from at least a portion of the lower adhesion part 44 extending from the outer peripheral end 11e. This elongates the distance over which the main terminal 22 can substantially vibrate and can restrict the main terminal 23 from being broken. The same applies also to the external connection terminals other than the external connection terminal including the main terminal 22.

Also, only the portion of the connection surface 40 which is closer to the outer peripheral end 11e is used as the lower adhesion part 44, while the portion of the connection surface 40 which is located between the lower adhesion part 44 and the connected part 40a is used as the higher adhesion part 43. This can restrict the entrance of moisture or the like into the connected part 40a, while allowing the lower adhesion part 44 to be provided in the connection surface 40.

Fifth Embodiment

For the present embodiment, the previous embodiments can be referred to. Accordingly, a description of components which are common to those of the semiconductor device 10 shown in each of the previous embodiments is omitted.

Figure 14:
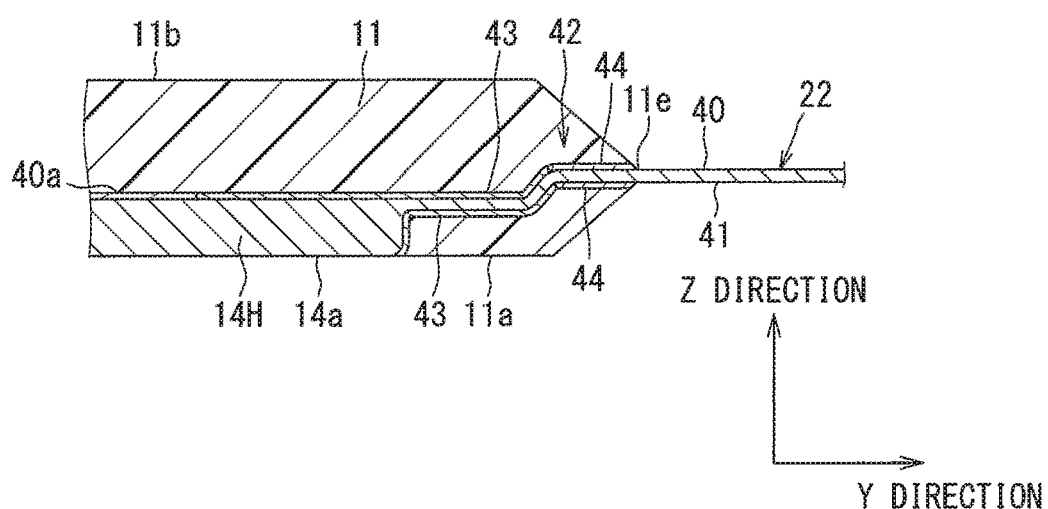
FIG. 14 is a cross-sectional view, which corresponds to FIG. 7, of a semiconductor device according to a fifth embodiment.

In the present embodiment, as shown in FIG. 14, on both of the connection surface 40 and the back surface 41, the respective lower adhesion parts 44 are provided. Of the connection surface 40, only a portion located between the connected part 40a and the outer peripheral end 11e and closer to the connected part 40a serves as the higher adhesion part 43. Of the connection surface 40, the portion between the higher adhesion part 43 and the outer peripheral end 11e serves as the lower adhesion part 44. In the covered part 42, only a portion of the back surface 41 serves as the lower adhesion part 44. In the extending direction of the outer connection terminal including the main terminal 22, only a local range extending from the outer peripheral end 11e corresponds to the lower adhesion part 44. The portion between the lower adhesion part 44 and the heat dissipation surface 14a serves as the higher adhesion part 43 having the same configuration as that of the higher adhesion part 43 of the connection surface 40. This results in the configuration including the lower adhesion part 44 (see FIG. 12) shown in the third embodiment and the lower adhesion part 44 (see FIG. 13) shown in the fourth embodiment. FIG. 14 also corresponds to FIG. 7 and shows the external connection terminal including the main terminal 22 by way of example.

This also allows the sealing resin body 11 to peel from at least one of the lower adhesion part 44 of the connection surface 40 and the lower adhesion part 44 of the back surface 41. As a result, the distance over which the main terminal 22 can substantially vibrate is elongated to be able to restrict the main terminal 22 from being broken. Note that the same applies also to the external connection terminals other than the external connection terminal including the main terminal 22.

Also, in the connection surface 40 and the back surface 41, the lower adhesion parts 44 are provided at positions corresponding to each other in a projected view along the Z-direction between the connection surface 40 and the back surface 41. Accordingly, when the sealing resin body 11 peels from both of the connection surface 40 and the back surface 41, the main terminal 22 is more likely to vibrate. This can restrict the main terminal 22 from being broken.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

In each of the foregoing embodiments described above, as an example of the semiconductor device 10, the 2-in-1 package having the two semiconductor chips 12 is shown. However, the number of the semiconductor chips 12 is not limited. For example, the semiconductor device 10 is also applicable to a 1-in-1 package having only one of the six semiconductor chips 12 forming the upper and lower arms corresponding to three phases or to a 6-in-1 package having the six semiconductor chips 12.

In the example shown in each of the above embodiments, the IGBT and the FWD are formed in the same chip. However, the present disclosure is also applicable to a configuration in which the IGBT and the FWD are formed in different chips.

In the example shown in each of the above embodiments, the semiconductor device 10 has the terminals 17. However, the semiconductor device 10 may also have a configuration which does not have the terminals 17. In this case, it is appropriate to provide the second heat sinks 19 with projecting portions projecting toward the emitter electrodes 13b.

In the example shown in each of the above embodiments, the heat dissipation surfaces 14a and 19a are exposed from the sealing resin body 11. However, the present disclosure is also applicable to a configuration in which the heat dissipation surfaces 14a and 19a are not exposed from the sealing resin body 11.

In each of the embodiments described above, as an example of the resin-sealed electronic device, the semiconductor device 10 is shown, but the resin-sealed electronic device is not limited thereto. The present disclosure is applicable to any resin-sealed electronic device having a configuration which includes at least one electronic component, a sealing resin body sealing the electronic component, and a plurality of conductive members electrically connected to the electronic component in the sealing resin body, having respective portions exposed from the sealing resin body to the outside, and set at different potentials and in which the conductive members include an external connection terminal extending from the inside of the sealing resin body to the outside thereof.

Figure 15:
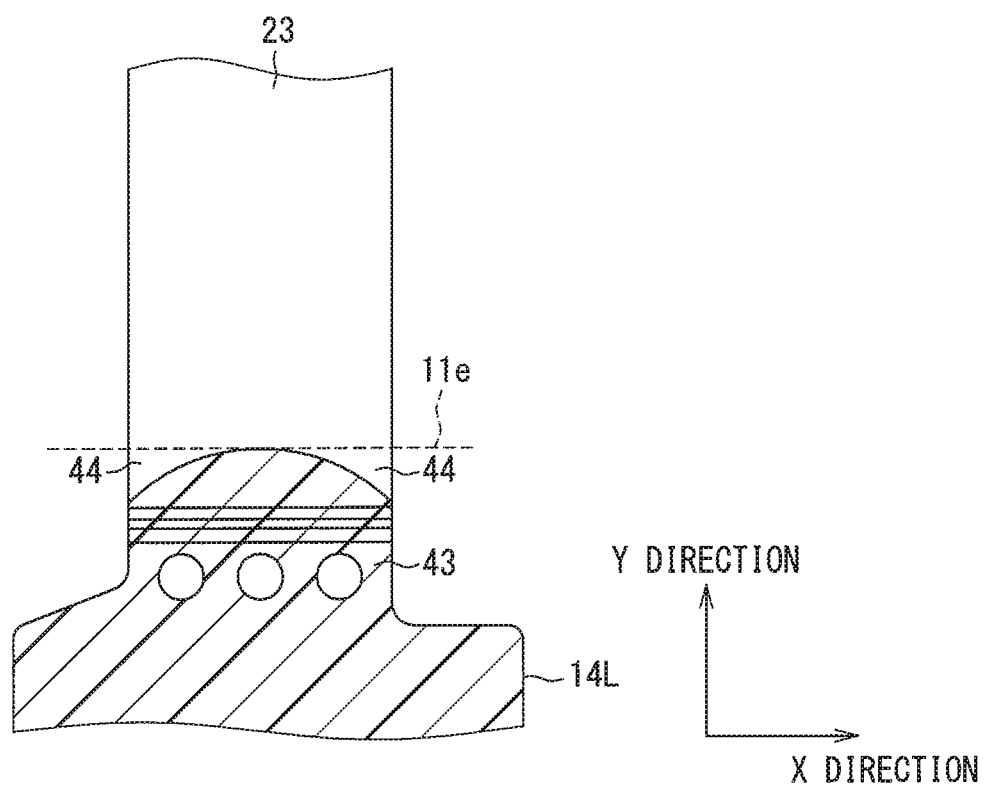
FIG. 15 is a plan view showing a modification.

In the example shown in the above embodiment (see FIG. 5), the end portion of the higher adhesion part 43 which is closer to the outer peripheral end 11e has a shape extending along the outer peripheral end 11e, i.e., a linear shape. However, the shape of the end portion of the higher adhesion part 43 is not limited to that in the foregoing example. For example, as shown in the modification in FIG. 15, the end portion of the higher adhesion part 43 which is closer to the outer peripheral end 11e may also have an arcuate shape. In FIG. 15, the vertex of the arcuate shape coincides with the outer peripheral end 11e. Accordingly, the both sides of the higher adhesion part 43 which are closer to the vertex serve as the lower adhesion parts 44. This can restrict the localization of a stress between the sealing resin body 11 and the external connection terminal and consequently restrict the peeling of the sealing resin body 11.

In the example shown in the above embodiment, one end of the main terminal 24 in the Y-direction is used as the connected part 40a, but the connected part 40a is not limited thereto. For example, in the same manner as in each of the signal terminals 25, it may also be possible to form the higher adhesion part 43 in a local range extending from the end portion of the main terminal 24 which is closer to the semiconductor chip 12 and interpose the connected part 40a of the connection surface 40 between the higher adhesion parts 43.

Alternatively, in the same manner as in each of the external connection terminal including the main terminal 22 and the external connection terminal including the main terminal 23, it may also be possible to provide the higher adhesion part 43 such that each of the connected part 40a of the main terminal 24 and the connected part 40a of each of the signal terminals 25 is surrounded thereby.

The locations of the higher adhesion part 43 and the lower adhesion part 44 are not limited to those in the examples shown above. It is sufficient as long as, in the covered part 42, the lower adhesion part 44 is provided in at least one of the connection surface 40 and the back surface 41 to extend from the outer peripheral end 11e along the extending direction of the connection surface 40 or the back surface 41 and the higher adhesion part 43 is provided in the portion different from that in which the lower adhesion part 44 is provided.

The metal forming the metal thin film 47 is not limited to Ni. Also, the uneven oxide film 48 is not limited to an oxide of Ni. The uneven oxide film 48 may be made appropriately of an oxide of the same metal as that forming the metal thin film 47.

The invention claimed is:

1. An electronic device, comprising:
at least one electronic component;
a sealing resin body sealing the electronic component; and
a plurality of conductive members electrically connected to the electronic component in the sealing resin body, including respective portions exposed from the sealing resin body to an outside of the sealing resin body, and having different potentials, wherein
the plurality of conductive members include a heat sink and a terminal, the terminal extending from an inside of the sealing resin body to the outside of the sealing resin body,
a surface of the terminal includes a higher adhesion surface and a lower adhesion surface, the higher adhesion surface and the lower adhesion surface being covered with the sealing resin body, and the lower adhesion surface has an adhesion strength to the sealing resin body that is lower than an adhesion strength of the higher adhesion surface to the sealing resin body, and
the lower adhesion surface is provided in an entire portion of a back surface of the terminal, the back surface being opposite to a connection surface of the terminal which is adjacent to a connection part electrically connected to the electronic component, and
the higher adhesion surface is provided in the connection surface.

2. The electronic device according to claim 1, wherein the higher adhesion surface is provided at least in a portion of the connection surface which is located between the connected part and an outer peripheral end of the sealing resin body and extending from the connected part.

3. The electronic device according to claim 2, wherein the higher adhesion surface is provided in an entire portion of the connection surface which is located between the connected part and the outer peripheral end of the sealing resin body.

4. The electronic device according to claim 2, wherein the higher adhesion surface surrounds the connected part of the connection surface.

5. An electronic device, comprising:
at least one electronic component;
a sealing resin body sealing the electronic component; and
a plurality of conductive members electrically connected to the electronic component in the sealing resin body, including respective portions exposed from the sealing resin body to an outside of the sealing resin body, and having different potentials, wherein
the plurality of conductive members include a heat sink and a terminal, the terminal extending from an inside of the sealing resin body to the outside of the sealing resin body,
a surface of the terminal has, as a part covered with the sealing resin body, a higher adhesion part and a lower adhesion part, and the lower adhesion part has an adhesion to the sealing resin body which is lower than an adhesion of the higher adhesion part to the sealing resin body, and
the lower adhesion part is provided in an entire portion of a back surface of the terminal, the back surface being opposite to a connection surface of the terminal which is adjacent to a connection part electrically connected to the electronic component, and
the higher adhesion part is provided in the connection surface, wherein
of the higher adhesion part and the lower adhesion part, only the higher adhesion part has a roughened surface.

6. The electronic device according to claim 1, wherein of the higher adhesion surface and the lower adhesion surface, only the higher adhesion surface is provided with a polymer film which enhances an adhesion to the sealing resin body.

7. The electronic device according to claim 1, which is used for a power conversion device.

8. An electronic device, comprising:
at least one electronic component;
a sealing resin body sealing the electronic component; and
a plurality of conductive members electrically connected to the electronic component in the sealing resin body, including respective portions exposed from the sealing resin body to an outside of the sealing resin body, and having different potentials, wherein
the plurality of conductive members include an external connection terminal extending from an inside of the sealing resin body to the outside of the sealing resin body,
a surface of the external connection terminal includes a higher adhesion surface and a lower adhesion surface, the higher adhesion surface and the lower adhesion surface being covered with the sealing resin body and excluding a connection part electrically connected to the electronic component, and the lower adhesion surface has an adhesion strength to the sealing resin body that is lower than an adhesion strength of the higher adhesion surface to the sealing resin body, and
in a predetermined region from an outer peripheral end of the sealing resin body along an extending direction of the external connection terminal, the higher adhesion surface is provided in a connection surface which includes the connected part, and the lower adhesion surface is provided in a back surface opposite to the connection surface in a thickness direction.

9. The electronic device according to claim 8, wherein the lower adhesion surface is provided in an entire portion of the back surface which is covered with the sealing resin body.

10. The electronic device according to claim 8, wherein the lower adhesion surface is provided only in a portion of the back surface in the extending direction.

11. The electronic device according to claim 8, wherein the higher adhesion surface is provided at least in a portion of the connection surface which is located between the connected part and the outer peripheral end of the sealing resin body and extending from the connected part.

12. The electronic device according to claim 11, wherein the higher adhesion surface is provided in an entire portion of the connection surface which is located between the connected part and the outer peripheral end of the sealing resin body.

13. The electronic device according to claim 11, wherein the higher adhesion surface surrounds the connected part of the connection surface.

14. An electronic device, comprising:
at least one electronic component;
a sealing resin body sealing the electronic component; and
a plurality of conductive members electrically connected to the electronic component in the sealing resin body, including respective portions exposed from the sealing resin body to an outside of the sealing resin body, and having different potentials, wherein
the plurality of conductive members include an external connection terminal extending from an inside of the sealing resin body to the outside of the sealing resin body,
a surface of the external connection terminal has, as a part covered with the sealing resin body and excluding a connection part electrically connected to the electronic component, a higher adhesion part and a lower adhesion part, and the lower adhesion part has an adhesion to the sealing resin body which is lower than an adhesion of the higher adhesion part to the sealing resin body, and
in a predetermined region from an outer peripheral end of the sealing resin body along an extending direction of the external connection terminal, the higher adhesion part is provided in a connection surface which includes the connected part, and the lower adhesion part is provided in a back surface opposite to the connection surface in a thickness direction, wherein
of the higher adhesion part and the lower adhesion part, only the higher adhesion part has a roughened surface.

15. The electronic device according to claim 8, wherein of the higher adhesion surface and the lower adhesion surface, only the higher adhesion surface is provided with a polymer film which enhances an adhesion to the sealing resin body.

16. The electronic device according to claim 8, which is used for a power conversion device.

17. The electronic device according to claim 1, wherein both the higher adhesion surface and the lower adhesion surface are directly in contact with the sealing resin body.

18. The electronic device according to claim 8, wherein both the higher adhesion surface and the lower adhesion surface are directly in contact with the sealing resin body.

* * * * *